United States Patent
Kawashima

(10) Patent No.: US 8,557,503 B2
(45) Date of Patent: *Oct. 15, 2013

(54) RELIEF PRINTING PLATE PRECURSOR FOR LASER ENGRAVING, PROCESS FOR MAKING RELIEF PRINTING PLATE, AND RELIEF PRINTING PLATE

(75) Inventor: Takashi Kawashima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/105,542

(22) Filed: May 11, 2011

(65) Prior Publication Data

US 2011/0293897 A1 Dec. 1, 2011

(30) Foreign Application Priority Data

May 31, 2010 (JP) .................................. 2010-123820

(51) Int. Cl.
- *C08K 5/24* (2006.01)
- *G03C 1/00* (2006.01)
- *B05D 3/06* (2006.01)

(52) U.S. Cl.
USPC .................. 430/281.1; 430/270.1; 430/286.1; 524/261; 264/400; 522/2; 428/156

(58) Field of Classification Search
USPC .......................... 524/61, 261; 428/156, 195.1; 430/281.1, 270.1, 286.1; 522/2; 264/400; 525/477
See application file for complete search history.

(56) References Cited

U.S. PATENT DOCUMENTS

| | | | |
|---|---|---|---|
| 3,945,957 A * | 3/1976 | Noshiro et al. .................. 524/66 |
| 5,407,781 A * | 4/1995 | Feinberg et al. ............ 430/271.1 |
| 7,901,863 B2 * | 3/2011 | Yamada et al. ............. 430/270.1 |
| 2004/0157162 A1 * | 8/2004 | Yokota et al. .................. 430/306 |
| 2009/0075199 A1 * | 3/2009 | Lungu ........................ 430/281.1 |
| 2009/0246469 A1 * | 10/2009 | Kawashima et al. .......... 428/156 |
| 2011/0156317 A1 * | 6/2011 | Yoshida ........................ 264/400 |
| 2011/0293897 A1 * | 12/2011 | Kawashima ............... 428/195.1 |
| 2011/0311776 A1 * | 12/2011 | Sugasaki et al. .............. 428/156 |
| 2011/0318537 A1 * | 12/2011 | Yoshida ........................ 428/156 |
| 2011/0319563 A1 * | 12/2011 | Yamashita ....................... 525/61 |

FOREIGN PATENT DOCUMENTS

| | | |
|---|---|---|
| JP | 11-338139 A | 12/1999 |
| JP | 2004-174758 A | 6/2004 |
| WO | 2005/070691 A1 | 8/2005 |

* cited by examiner

*Primary Examiner* — Hannah Pak
(74) *Attorney, Agent, or Firm* — Sughrue Mion, PLLC

(57) ABSTRACT

A relief printing plate precursor for laser engraving is provided that includes above a support, as a crosslinked relief-forming layer, a thermally crosslinked layer of a resin composition for laser engraving that includes (Component A) a compound containing a hydrolyzable silyl group and/or a silanol group and that does not include (Component B) a binder polymer or includes it at less than 2 wt % relative to the total weight on a non-volatile component basis. There are also provided a process for making a relief printing plate that includes a step of preparing the relief printing plate precursor for laser engraving and a step of forming a relief layer by laser-engraving the crosslinked relief-forming layer, and a relief printing plate that includes a relief layer formed by the process for making a relief printing plate.

16 Claims, No Drawings

RELIEF PRINTING PLATE PRECURSOR FOR LASER ENGRAVING, PROCESS FOR MAKING RELIEF PRINTING PLATE, AND RELIEF PRINTING PLATE

BACKGROUND OF THE INVENTION

1. Field of the Invention

The present invention relates to a relief printing plate precursor for laser engraving, a process for making same, and a relief printing plate.

2. Description of Related Art

Conventionally, a hydrophobic laser engraving type printing plate employing natural rubber, synthetic rubber, a thermoplastic elastomer, etc. is used (for example, ref. JP-A-11-338139 (JP-A denotes a Japanese unexamined patent application publication)). As a technique for improving the rinsing properties of engraving residue generated by laser engraving, a technique in which porous inorganic fine particles are contained in a relief-forming layer, and liquid residue is adsorbed on these particles, thus improving removability has been proposed (for example, ref. e.g. JP-A-2004-174758). Furthermore, it has been shown that an organic silicon compound contained in a laser-engravable photosensitive resin composition reduces the percentage residue remaining after engraving (making it difficult for residue to be attached), and engraving residue can easily be wiped away by a cloth impregnated with an organic solvent (for example, ref. International Patent Application WO 2005-070691).

SUMMARY OF THE INVENTION

It is an object of the present invention to provide a relief printing plate precursor for laser engraving that has excellent rinsing properties for engraving residue generated when laser-engraving, a process for making a relief printing plate employing same, and a relief printing plate obtained by the plate making process.

The above-mentioned object of the present invention has been achieved by means described in <1>, <13>, and <15> below. They are described below together with <2> to <12>, <14>, <16>, and <17>, which are preferred embodiments.

<1> A relief printing plate precursor for laser engraving comprising above a support, as a crosslinked relief-forming layer, a thermally crosslinked layer of a resin composition for laser engraving that comprises (Component A) a compound containing a hydrolyzable silyl group and/or a silanol group and that does not comprise (Component B) a binder polymer or comprises it at less than 2 wt % relative to the total weight on a non-volatile component basis, <2> the relief printing plate precursor for laser engraving according to <1>, wherein Component A is a compound having 2 to 6 hydrolyzable silyl groups and silanol groups, <3> the relief printing plate precursor for laser engraving according to <2>, wherein Component A is a compound in which the minimum number of atoms connecting silicon atoms contained in Component A is at least 10, <4> the relief printing plate precursor for laser engraving according to any one of <1> to <3>, wherein Component A is a compound having two alkoxy and hydroxy groups in total on the same silicon atom, <5> the relief printing plate precursor for laser engraving according to any one of <1> to <4>, wherein Component A does not contain an ethylenically unsaturated bond, <6> the relief printing plate precursor for laser engraving according to any one of <1> to <5>, wherein the resin composition for laser engraving further comprises (Component C) a crosslinking catalyst for promoting formation of a crosslinked structure of Component A, <7> the relief printing plate precursor for laser engraving according to any one of <1> to <6>, wherein the resin composition for laser engraving further comprises (Component D) a plasticizer, <8> the relief printing plate precursor for laser engraving according to any one of <1> to <7>, wherein the resin composition for laser engraving further comprises (Component E) a polymerizable compound, <9> the relief printing plate precursor for laser engraving according to any one of <1> to <8>, wherein the resin composition for laser engraving further comprises (Component F) a polymerization initiator, <10> the relief printing plate precursor for laser engraving according to any one of <1> to <9>, wherein the resin composition for laser engraving further comprises (Component G) inorganic particles, <11> the relief printing plate precursor for laser engraving according to any one of <1> to <10>, wherein the resin composition for laser engraving further comprises (Component H) a photothermal conversion agent, <12> the relief printing plate precursor for laser engraving according to any one of <1> to <11>, wherein the resin composition for laser engraving further comprises (Component I) a fragrance, <13> a process for making a relief printing plate, comprising a step of preparing the relief printing plate precursor for laser engraving according to any one of <1> to <12>, and a step of forming a relief layer by laser-engraving the crosslinked relief-forming layer, <14> the process for making a relief printing plate according to <13>, wherein it further comprises a rinsing step of rinsing the engraved relief layer surface by means of an aqueous rinsing liquid, <15> a relief printing plate comprising a relief layer formed by the process for making a relief printing plate according to <13> or <14>, <16> the relief printing plate according to <15>, wherein the relief layer has a thickness of at least 0.05 mm but no greater than 10 mm, and <17> the relief printing plate according to <15> or <16>, wherein the relief layer has a Shore A hardness at 25° C. of at least 50° but no greater than 90°.

DETAILED DESCRIPTION OF THE INVENTION

The relief printing plate precursor for laser engraving of the present invention comprises above a support, as a crosslinked relief-forming layer, a thermally crosslinked layer of a resin composition for laser engraving that comprises (Component A) a compound containing a hydrolyzable silyl group and/or a silanol group and that does not comprise (Component B) a binder polymer or comprises it at less than 2 wt % relative to the total weight (hereinafter, also called a 'resin composition for laser engraving of the present invention').

In the present invention, the notation 'lower limit to upper limit', which expresses a numerical range, means 'at least the lower limit but no greater than the upper limit'. That is, they are numerical ranges that include the upper limit and the lower limit.

(Resin Composition for Laser Engraving)

The resin composition for laser engraving of the present invention has excellent rinsing properties for engraving residue. Therefore, the time for forming a relief layer and making a plate can be reduced.

The resin composition for laser engraving of the present invention may be used without any particular limitation in a wide range of other applications in addition to a relief-forming layer of a relief printing plate precursor that is subjected to laser engraving. For example, it may be used in formation of another material form in which asperities or apertures are formed on the surface, for example, various types of printing plates or various types of moldings in which an image is formed by laser engraving, such as an intaglio plate, a stencil plate, or a stamp. Among them, a preferred embodiment is use in formation of a relief-forming layer provided above an appropriate support.

In the present invention, a layer having a flat surface formed from an uncrosslinked resin composition for laser engraving is called a relief-forming layer. A thermally crosslinked layer formed by thermally crosslinking the relief-forming layer is called a crosslinked relief-forming layer. A layer on which asperities are formed on the surface by laser-engraving the crosslinked relief-forming layer is called a relief layer.

Each component contained in the resin composition for laser engraving is explained below.

<(Component A) Compound Having Hydrolyzable Silyl Group and/or Silanol Group>

The resin composition for laser engraving of the present invention comprises (Component A) a compound having a hydrolyzable silyl group and/or a silanol group.

The 'hydrolyzable silyl group' is a silyl group having hydrolyzability. Examples of the hydrolyzable group include an alkoxy group, a mercapto group, a halogen atom, an amide group, an acetoxy group, an amino group, and an isopropenoxy group. The silyl group is hydrolyzed to form a silanol group. The silanol group is dehydration-condensed to form a siloxane bond.

Component A is preferably a compound having 2 to 6 hydrolyzable silyl groups and silanol groups in total, more preferably a compound having 2 or 3 thereof, and yet more preferably a compound having 2 thereof. When in this range, even if the content of the binder polymer in the crosslinked relief-forming layer is less than 2 wt %, the rubber elasticity necessary as a printing plate can be exhibited.

Such a hydrolyzable silyl group or silanol group is preferably one represented by Formula (A-1).

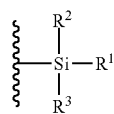

(A-1)

In Formula (A-1) above, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group.

The remainder of $R^1$ to $R^3$ independently denotes a hydrogen atom, a halogen atom, or a monovalent organic substituent (examples including an alkyl group, an aryl group, an alkenyl group, an alkynyl group, and an aralkyl group).

In Formula (A-1) above, the hydrolyzable group bonded to the silicon atom is particularly preferably an alkoxy group or a halogen atom, and more preferably an alkoxy group.

From the viewpoint of rinsing properties and printing durability, the alkoxy group is preferably an alkoxy group having 1 to 30 carbon atoms, more preferably an alkoxy group having 1 to 15 carbon atoms, yet more preferably an alkoxy group having 1 to 5 carbon atoms, particularly preferably an alkoxy group having 1 to 3 carbon atoms, and most preferably a methoxy group or an ethoxy group.

Furthermore, examples of the halogen atom include an F atom, a Cl atom, a Br atom, and an I atom, and from the viewpoint of ease of synthesis and stability it is preferably a Cl atom or a Br atom, and more preferably a Cl atom.

With regard to the hydrolyzable group, 1 to 4 thereof may be bonded to one silicon atom, and the total number of hydrolyzable groups in Formula (A-1) is preferably 2 or 3. When there are 2 or more hydrolyzable groups bonded to a silicon atom, they may be identical to or different from each other. In the present invention, Component A is preferably a compound having a total of 2 to 4 hydroxy groups and alkoxy groups having 1 to 4 carbons on the same silicon atom, more preferably a compound having 2 or 3 thereof, and yet more preferably a compound having 2 thereof. When in this range, even if the content of the binder polymer in the crosslinked relief-forming layer is less than 2 wt %, it is possible for the rubber elasticity necessary as a printing plate to be exhibited.

Specific preferred examples of the alkoxy group include a methoxy group, an ethoxy group, a propoxy group, an isopropoxy group, a butoxy group, a tert-butoxy group, a phenoxy group, and a benzyloxy group. A plurality of each of these alkoxy groups may be used in combination, or a plurality of different alkoxy groups may be used in combination.

Examples of the alkoxysilyl group having an alkoxy group bonded thereto include a trialkoxysilyl group such as a trimethoxysilyl group, a triethoxysilyl group, a triisopropoxysilyl group, or a triphenoxysilyl group; a dialkoxymonoalkylsilyl group such as a dimethoxymethylsilyl group or a diethoxymethylsilyl group; and a monoalkoxydialkylsilyl group such as a methoxydimethylsilyl group or an ethoxydimethylsilyl group.

Since the rubber elasticity necessary as a printing plate can be exhibited even if the content of the binder polymer is less than 2 wt %, Component A is preferably a compound in which the minimum number of atoms connecting silicon atoms contained in Component A is at least 10. The minimum number of atoms connecting silicon atoms is preferably 10 to 200, yet more preferably 15 to 150, and particularly preferably 20 to 100.

Component A preferably has at least a sulfur atom, an ester bond (—OCO— or —COO—), a urethane bond (—OCON(R)— or —N(R)COO—), an ether bond, a urea bond (—NH-CONH—), or an imino group (—N(R)—). R denotes a hydrogen atom or a substituent. Examples of the substituent denoted by R include an alkyl group, an aryl group, an alkenyl group, an alkynyl group, and an aralkyl group.

Among them, from the viewpoint of crosslinkability, Component A preferably comprises a sulfur atom, and from the viewpoint of removability (rinsing properties) of engraving residue it is preferable for it to comprise an ester bond, a urethane bond or an ether bond (in particular, an ether bond contained in an oxyalkylene group), which is easily decomposed by aqueous alkali. Among them, Component A particularly preferably comprises an ester bond or an ether bond contained in an oxyalkylene group.

The oxyalkylene group is preferably a polyoxyalkylene group in which 2 to 40 oxyalkylene groups are connected, and more preferably a polyoxyalkylene group in which 4 to 20 thereof are connected. The oxyalkylene group is preferably an oxyalkylene group having 2 to 10 carbons, more preferably an oxyalkylene group having 2 to 4 carbons, and yet more preferably an oxyethylene group.

The sulfur atom-containing Component A functions as a vulcanizing agent or a vulcanization accelerator when a vulcanization treatment is carried out. When the binder polymer (Component B) is for example a conjugated diene monomer unit-containing polymer, a polymer reaction (crosslinking) is promoted. As a result, the rubber elasticity necessary as a printing plate is exhibited. Furthermore, the strength of the crosslinked relief-forming layer and the relief layer is improved.

Furthermore, Component A in the present invention is preferably a compound that does not have a polymerizable group. The polymerizable group referred to here means a cationically polymerizable group such as an epoxy group or an oxetanyl group and a radically polymerizable group such as an ethylenically unsaturated bond-containing group (e.g. a vinyl group, a (meth)acryloyl group, or a (meth)acryloyloxy group). Among them, Component A is more preferably a compound that does not have an ethylenically unsaturated bond.

A method for synthesizing Component A is not particularly limited, and synthesis can be carried out by a known method. As one example, a representative synthetic method for a Component A containing a linking group having the above-mentioned specific structure is shown below.

<Synthetic Method for Component A Having Sulfide Group as Linking Group>

A synthetic method for a Component A having a sulfide group as a linking group (hereinafter, called as appropriate a 'sulfide linking group-containing Component A') is not particularly limited, but specific examples thereof include reaction of a Component A having a halogenated hydrocarbon group with an alkali metal sulfide, reaction of a Component A having a mercapto group with a halogenated hydrocarbon, reaction of a Component A having a mercapto group with a Component A having a halogenated hydrocarbon group, reaction of a Component A having a halogenated hydrocarbon group with a mercaptan, reaction of a Component A having an ethylenically unsaturated double bond with a mercaptan, reaction of a Component A having an ethylenically unsaturated double bond with a Component A having a mercapto group, reaction of a compound having an ethylenically unsaturated double bond with a Component A having a mercapto group, reaction of a ketone with a Component A having a mercapto group, reaction of a diazonium salt with a Component A having a mercapto group, reaction of a Component A having a mercapto group with an oxirane, reaction of a Component A having a mercapto group with a Component A having an oxirane group, reaction of a mercaptan with a Component A having an oxirane group, and reaction of a Component A having a mercapto group with an aziridine.

<Synthetic Method for Component A Having Imino Group as Linking Group>

A synthetic method for a Component A having an imino group as a linking group (hereinafter, called as appropriate an 'imino linking group-containing Component A') is not particularly limited, but specific examples include reaction of a Component A having an amino group with a halogenated hydrocarbon, reaction of a Component A having an amino group with a Component A having a halogenated hydrocarbon group, reaction of a Component A having a halogenated hydrocarbon group with an amine, reaction of a Component A having an amino group with an oxirane, reaction of a Component A having an amino group with a Component A having an oxirane group, reaction of an amine with a Component A having an oxirane group, reaction of a Component A having an amino group with an aziridine, reaction of a Component A having an ethylenically unsaturated double bond with an amine, reaction of a Component A having an ethylenically unsaturated double bond with a Component A having an amino group, reaction of a compound having an ethylenically unsaturated double bond with a Component A having an amino group, reaction of a compound having an acetylenically unsaturated triple bond with a Component A having an amino group, reaction of a Component A having an imine-based unsaturated double bond with an organic alkali metal compound, reaction of a Component A having an imine-based unsaturated double bond with an organic alkaline earth metal compound, and reaction of a carbonyl compound with a Component A having an amino group.

<Synthetic Method for Component a Having Urea Bond (Ureylene Group) as Linking Group>

A synthetic method for Component A having an ureylene group (hereinafter, called as appropriate a 'ureylene linking group-containing Component A') as a linking group is not particularly limited, but specific examples include synthetic methods such as reaction of a Component A having an amino group with an isocyanate ester, reaction of a Component A having an amino group with a Component A having an isocyanate ester, and reaction of an amine with a Component A having an isocyanate ester.

Component A is preferably a compound represented by Formula (A-2) or Formula (A-3) below.

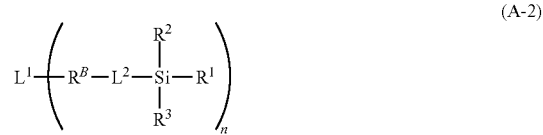

(In Formula (A-2) and Formula (A-3), $R^B$ denotes an ester bond, an amide bond, a urethane bond, a urea bond, or an imino group, $L^1$ denotes an n-valent linking group, $L^2$ denotes a divalent linking group, $L^{s1}$ denotes an m-valent linking group, $L^3$ denotes a divalent linking group, n and m independently denote an integer of 1 or greater, and $R^1$ to $R^3$ independently denote a hydrogen atom, a halogen atom, or a monovalent organic substituent. In addition, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group.)

$R^1$ to $R^3$ in Formula (A-2) and Formula (A-3) above have the same meanings as those of $R^1$ to $R^3$ in Formula (A-1) above, and preferred ranges are also the same.

From the viewpoint of rinsing properties and film strength, $R^B$ above is preferably an ester bond or a urethane bond, and is more preferably an ester bond.

The divalent or n-valent linking group denoted by $L^1$ to $L^3$ above is preferably a group formed from at least one type of atom selected from the group consisting of a carbon atom, a hydrogen atom, an oxygen atom, a nitrogen atom, and a sulfur atom, and is more preferably a group formed from at least one type of atom selected from the group consisting of a carbon atom, a hydrogen atom, an oxygen atom, and a sulfur atom. The number of carbon atoms of $L^1$ to $L^3$ above is preferably 2 to 60, and more preferably 2 to 30. $L^3$ preferably does not contain an ester bond, an amide bond, a urethane bond, a urea bond, and an imino group.

The m-valent linking group denoted by $L^{s1}$ above is preferably a group formed from a sulfur atom and at least one type of atom selected from the group consisting of a carbon atom, a hydrogen atom, an oxygen atom, a nitrogen atom, and a sulfur atom, and is more preferably an alkylene group or a group formed by combining two or more from an alkylene group, a sulfide group, and an imino group. The number of carbon atoms of $L^{s1}$ above is preferably 2 to 60, and more preferably 6 to 30.

n and m above are preferably independently integers of 1 to 10, more preferably integers of 2 to 10, yet more preferably integers of 2 to 6, and particularly preferably 2.

From the viewpoint of removability (rinsing properties) of engraving residue, the n-valent linking group denoted by $L^1$ and/or the divalent linking group denoted by $L^2$, or the divalent linking group denoted by $L^3$ preferably has an ether bond, more preferably has an ether bond contained in an oxyalkylene group, and yet more preferably has an ether bond contained in a polyoxyalkylene group.

Among compounds represented by Formula (A-2) or Formula (A-3), the n-valent linking group denoted by $L^1$ and/or the divalent linking group denoted by $L^2$ in Formula (A-2) are preferably groups having a sulfur atom.

Specific examples of Component A that can be applied to the present invention are shown below. Examples thereof include vinyltrichlorosilane, vinyltrimethoxysilane, vinyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, p-styryltrimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-mercaptopropyltriethoxysilane, mercaptomethyltrimethoxysilane, dimethoxy-3-mercaptopropylmethylsilane, 2-(2-aminoethylthioethyl)diethoxymethylsilane, 3-(2-acetoxyethylthiopropyl)dimethoxymethylsilane, 2-(2-aminoethylthioethyl)triethoxysilane, dimethoxymethyl-3-(3-phenoxypropylthiopropyl)silane, bis(triethoxysilylpropyl)disulfide, bis(triethoxysilylpropyl)tetrasulfide, 1,4-bis(triethoxysilyl)benzene, bis(triethoxysilyl)ethane, 1,6-bis(trimethoxysilyl)hexane, 1,8-bis(triethoxysilyl)octane, 1,2-bis(trimethoxysilyl)decane, bis(triethoxysilylpropyl)amine, bis(trimethoxysilylpropyl)urea, γ-chloropropyltrimethoxysilane, γ-ureidopropyltriethoxysilane, trimethylsilanol, diphenylsilanediol, and triphenylsilanol. Other than the above, the compounds shown below can be cited as preferred examples, but the present invention should not be construed as being limited thereto.

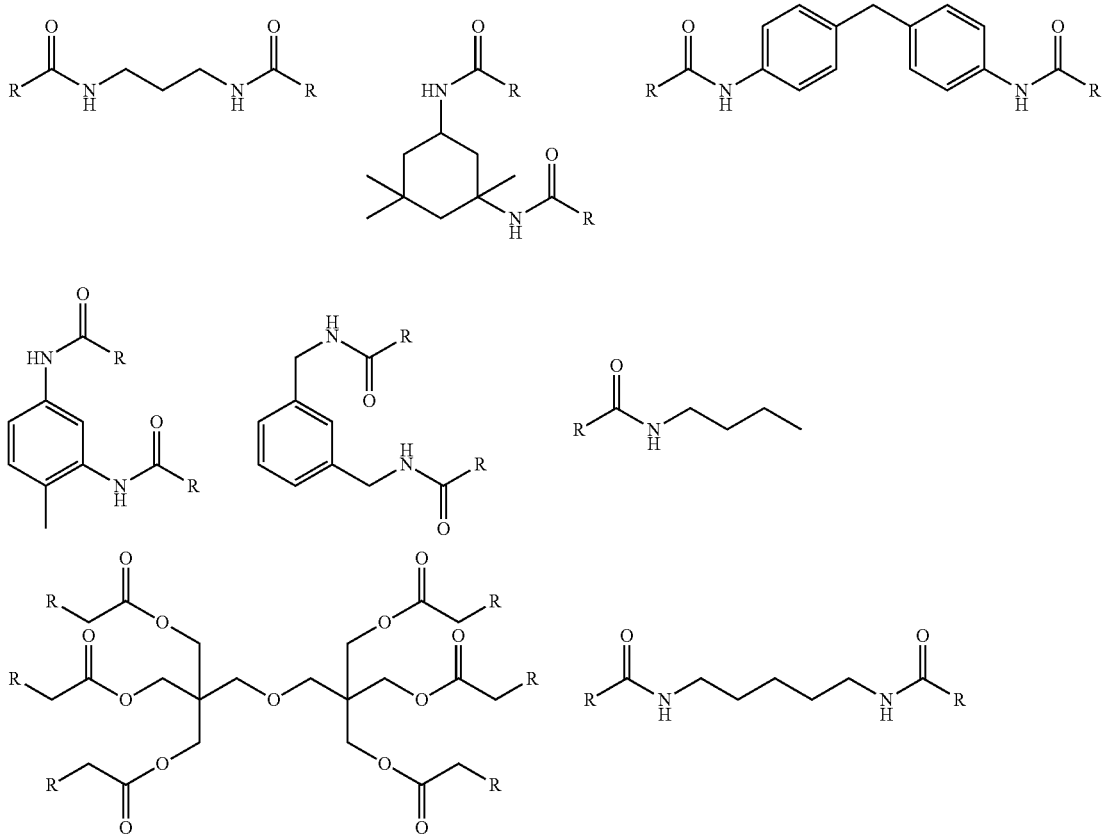

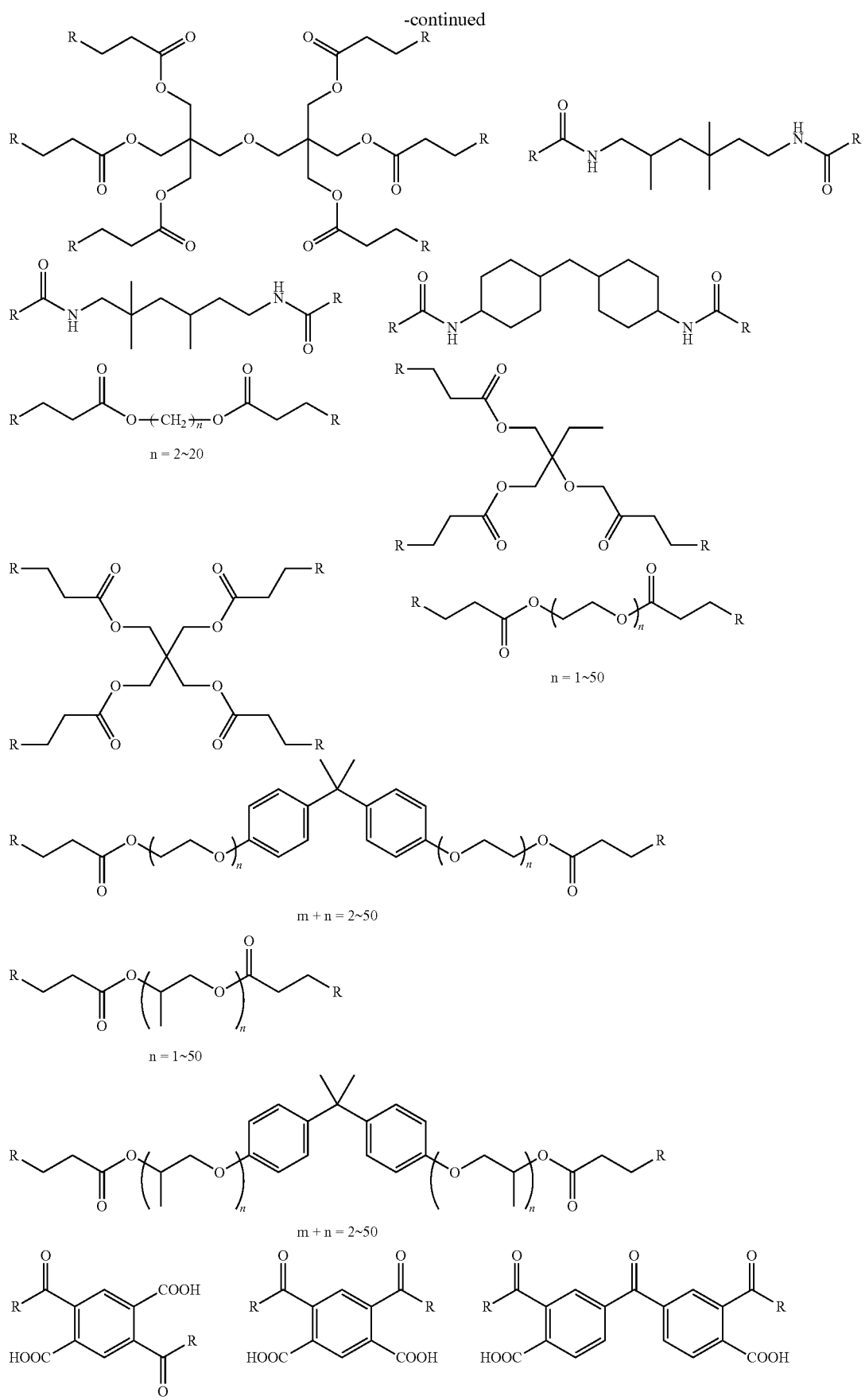

-continued
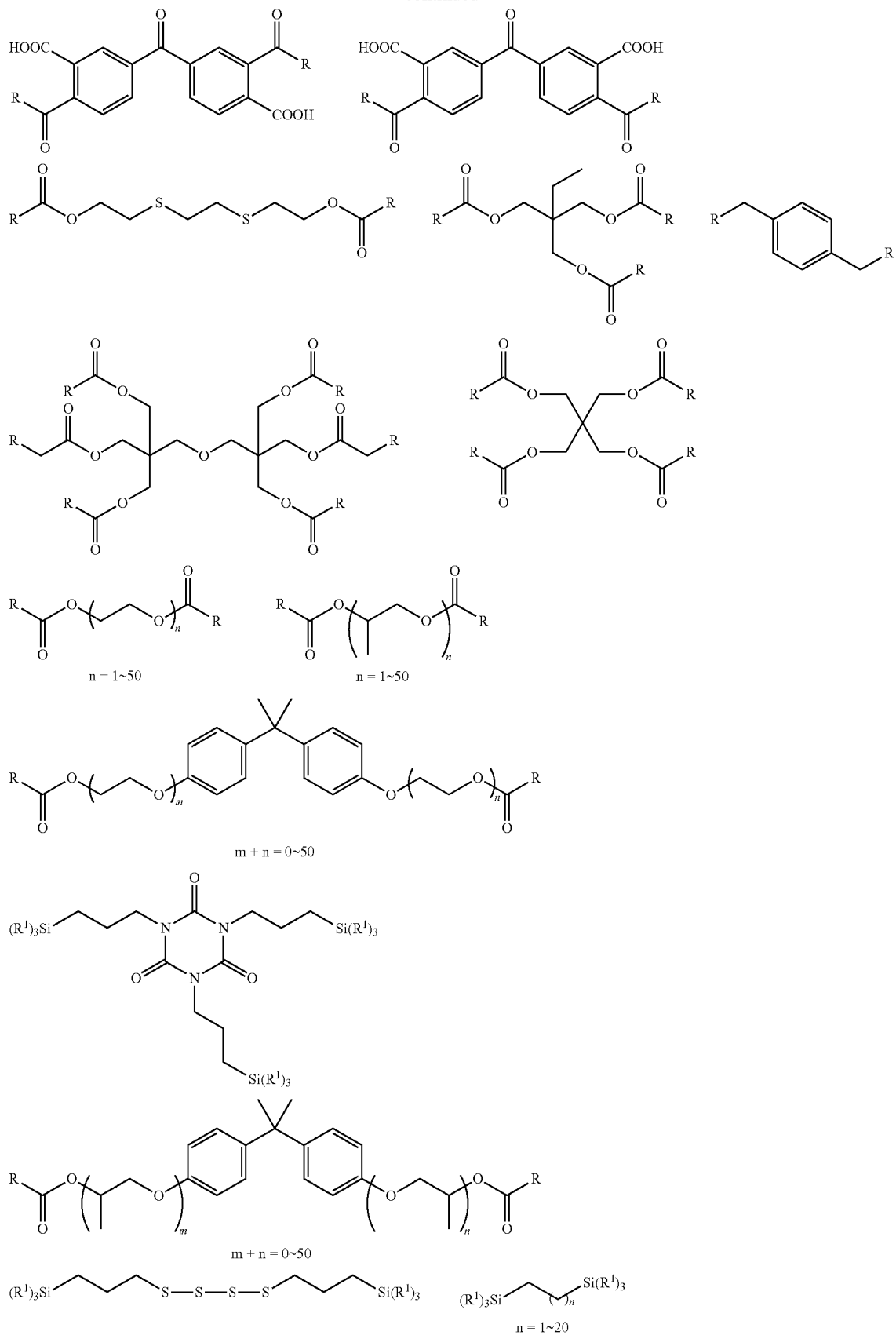

In each of the formulae above, R and $R^1$ denotes a partial structure selected from the structures below. When a plurality of Rs and $R^1$s are present in the molecule, they may be identical to or different from each other, and are preferably identical to each other in terms of synthetic suitability.

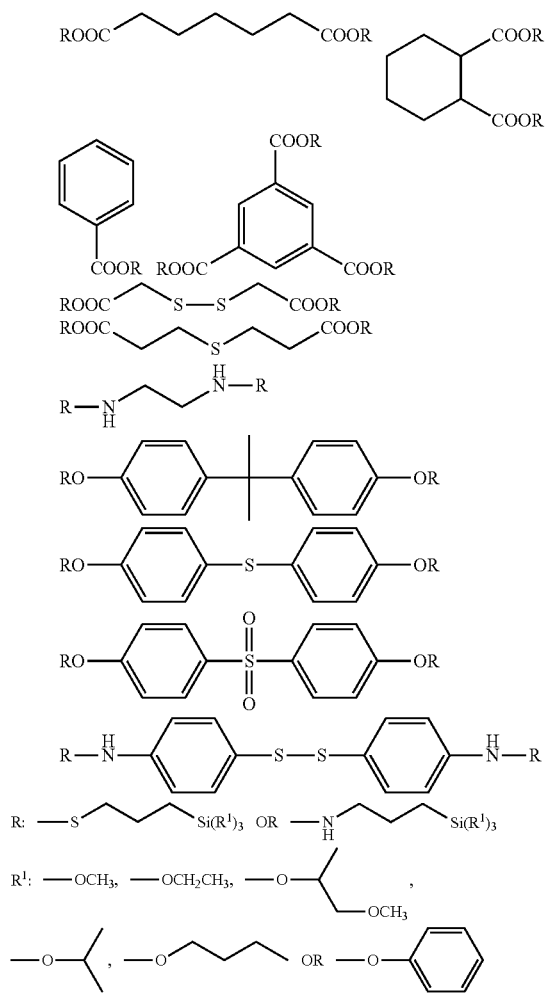

In each of the formulae above, R denotes a partial structure selected from the structures below. $R^1$ is the same as defined above. When a plurality of Rs and $R^1$s are present in the molecule, they may be identical to or different from each other, and are preferably identical to each other in terms of synthetic suitability.

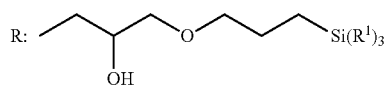

Component A may be obtained by synthesis as appropriate, but use of a commercially available product is preferable in terms of cost. Since Component A corresponds to for example commercially available silane products or silane coupling agents from Shin-Etsu Chemical Co., Ltd., Dow Corning Toray, Momentive Performance Materials Inc., Chisso Corporation, etc., the resin composition of the present invention may employ such a commercially available product by appropriate selection according to the intended application.

As Component A in the present invention, a partial hydrolysis-condensation product obtained using one type of compound having a hydrolyzable silyl group and/or a silanol group or a partial cohydrolysis-condensation product obtained using two or more types may be used. Hereinafter, these compounds may be called 'partial (co)hydrolysis-condensation products'.

Among silane compounds as partial (co)hydrolysis-condensation product precursors, from the viewpoint of versatility, cost, and film compatibility, a silane compound having a substituent selected from a methyl group and a phenyl group as a substituent on the silicon is preferable. Specific preferred examples of the precursor include methyltrimethoxysilane, methyltriethoxysilane, phenyltrimethoxysilane, phenyltriethoxysilane, dimethyldimethoxysilane, dimethyldiethoxysilane, diphenyldimethoxysilane, and diphenyldiethoxysilane.

In this case, as a partial (co)hydrolysis-condensation product, it is preferable to use a dimer (2 moles of silane compound is reacted with 1 mole of water to eliminate 2 moles of alcohol, thus giving a disiloxane unit) to 100-mer of the above-mentioned silane compound, more preferably a dimer to 50-mer, and yet more preferably a dimer to 30-mer, and it is also possible to use a partial cohydrolysis-condensation product formed using two or more types of silane compounds as starting materials.

As such a partial (co)hydrolysis-condensation product, ones commercially available as silicone alkoxy oligomers may be used (e.g. those from Shin-Etsu Chemical Co., Ltd.) or ones that are produced in accordance with a standard method by reacting a hydrolyzable silane compound with less than an equivalent of hydrolytic water and then removing by-products such as alcohol and hydrochloric acid may be used. When the production employs, for example, an acyloxysilane or an alkoxysilane described above as a hydrolyzable silane compound starting material, which is a precursor, partial hydrolysis-condensation may be carried out using as a reaction catalyst an acid such as hydrochloric acid or sulfuric acid, an alkali metal or alkaline earth metal hydroxide such as sodium hydroxide or potassium hydroxide, or an alkaline organic material such as triethylamine, and when the production is carried out directly from a chlorosilane, water and alcohol may be reacted using hydrochloric acid by-product as a catalyst.

With regard to Component A, only one type thereof may be used or two or more types thereof may be used in combination.

The content of Component A contained in the resin composition for laser engraving of the present invention is preferably in the range of 50 to 100 wt % on a non-volatile component basis, more preferably in the range of 52 to 95 wt %, and most preferably in the range of 54 to 90 wt %. Due to Component A being contained at 50 wt % or greater, compared with a conventional relief printing plate that contains a binder polymer at 2 wt % or greater, rinsing properties for residue generated during laser engraving can be improved.

<(Component B) Binder Polymer>

The resin composition for laser engraving of the present invention does not comprise (Component B) a binder polymer or comprises it at less than 2 wt % relative to the total weight on a non-volatile component basis (solids content basis excluding solvent).

When Component B is contained, Component B is preferably a non-elastomer. An 'elastomer' is a polymer having a glass transition temperature of no greater than normal temperature (ref. 'Kagaku Daijiten' (Science Dictionary) $2^{nd}$ edition, Ed. by Foundation for Advancement of International Science, Published by Maruzen, p. 154). Therefore, a non-elastomer denotes a polymer having a glass transition temperature that exceeds normal temperature (20° C.). From the viewpoint of a balance being achieved between engraving sensitivity and film formation properties, the glass transition temperature of the non-elastomer is preferably 20° C. to 200° C., more preferably 20° C. to 170° C., and yet more preferably 25° C. to 150° C.

From the viewpoint of film formation properties, examples of Component B include polyvinyl butyral (PVB) and a derivative thereof, an alcohol-soluble polyamide, a water-insoluble cellulose derivative, and an acrylic resin having a polar group in a side chain. As Component B, polyvinyl butyral and a derivative thereof, an alcohol-soluble polyamide, a cellulose derivative, an epoxy resin, an acrylic resin, a polyurethane resin, etc. described in paragraphs 0017 to 0139 of JP-A-2009-262526 can be preferably used, and among them polyvinyl butyral and a derivative thereof are preferable.

Polyvinyl butyral is represented by Formula (B-1), and a derivative thereof is formed by a repeating unit represented by Formula (B-1) being contained.

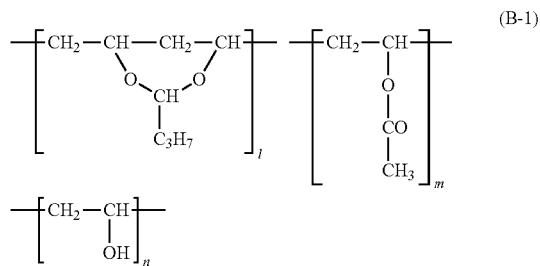

(B-1)

(In Formula (B-1), l, m, and n denote the content (mol %) in polyvinyl butyral of the respective repeating units in Formula (B-1), and the relationship l+m+n=100 is satisfied.)

The butyral content in the polyvinyl butyral and the derivative thereof (value I in Formula (B-1)) is preferably 30 to 90 mol %, more preferably 40 to 85 mol %, and particularly preferably 45 to 78 mol %.

From the viewpoint of a balance being achieved between engraving sensitivity and film formation properties, the weight-average molecular weight of the polyvinyl butyral and the derivative thereof is preferably 2,000 to 800,000, more preferably 5,000 to 500,000 and, from the viewpoint of improvement of rinsing properties for engraving residue, particularly preferably 10,000 to 300,000.

With regard to Component B, only one type thereof may be used or two or more types thereof may be used in combination.

From the viewpoint of rinsing properties and flexibility, the content of Component B contained in the resin composition for laser engraving of the present invention is less than 2 wt % on a non-volatile component basis. From the viewpoint of film strength, the lower limit is preferably at least 0.5 wt %, more preferably at least 1.0 wt %, and yet more preferably at least 1.5 wt %.

<(Component C) Crosslinking Catalyst>

The resin composition for laser engraving of the present invention preferably comprises a crosslinking catalyst (alcohol exchange reaction catalyst) in order to promote formation of a crosslinked structure of Component A. The crosslinking catalyst may be used without restrictions as long as it is a reaction catalyst normally used in a silane coupling reaction.

As the crosslinking catalyst, an acidic or basic compound is used as it is or in the form of a solution in which it is dissolved in a solvent such as water or an organic solvent (hereinafter, also called an acidic catalyst or basic catalyst respectively). The concentration when dissolved in a solvent is not particularly limited, and it may be selected appropriately according to the properties of the acidic or basic compound used, desired catalyst content, etc.

Examples of the acidic catalyst include a hydrogen halide such as hydrochloric acid, nitric acid, sulfuric acid, sulfurous acid, hydrogen sulfide, perchloric acid, hydrogen peroxide, carbonic acid, a carboxylic acid such as formic acid or acetic acid, a substituted carboxylic acid in which R of the structural formula RCOOH is substituted with another element or substituent, a sulfonic acid such as benzenesulfonic acid, phosphoric acid, a heteropoly acid, and an inorganic solid acid. Among them, from the view point of a balance being achieved between stability of a coating solution and curability, phosphoric acid is preferable.

Examples of the basic catalyst include an ammoniacal base such as aqueous ammonia, an amine, a boron-amine complex, an alkali metal hydroxide, an alkali metal alkoxide, an alkaline earth oxide, a quaternary ammonium salt compound, and a quaternary phosphonium salt compound.

Examples of the amine include (a) a hydrogenated nitrogen compound such as hydrazine; (b) an aliphatic amine, alicyclic amine or aromatic amine; (c) a condensed ring-containing cyclic amine; (d) an oxygen-containing amine such as an amino acid, an amide, an alcoholamine, an ether amine, an imide or a lactam; and (e) a heteroelement-containing amine having a heteroatom such as S or Se.

As the aliphatic amine (b), an amine compound represented by Formula (C-1) is preferable.

(C-1)

In Formula (C-1), $R^{c1}$ to $R^{c3}$ independently denote a hydrogen atom, a straight-chain or branched alkyl group having 1 to 10 carbon atoms, a cycloalkyl group having 5 to 10 carbon atoms, an aryl group having 6 to 20 carbon atoms, or a 3- to 10-membered sulfur atom- or oxygen atom-containing heterocycle, and the alkyl group and cycloalkyl group may have at least one unsaturated bond.

The amine compound represented by Formula (C-1) may have a substituent, and examples of the substituent include an alkyl group having 1 to 10 carbon atoms, an aryl group having 6 to 20 carbon atoms, an amino group, a (di)alkylamino group having an alkyl group having 1 to 6 carbon atoms, and a hydroxy group.

Two or more groups among Rd to Fe above may be bonded to form a C=N bond. Examples of an amine compound having a C=N bond include guanidine and 1,1,3,3-tetramethylguanidine.

Examples of the alicyclic amine (b) include an alicyclic amine in which a ring skeleton, where two or more groups among $R^{c1}$ to $R^{c3}$ in a compound represented by Formula (C-1) above are bonded, contains a nitrogen atom. Examples of the alicyclic amine include pyrrolidine, piperidine, piperazine, and quinuclidine.

Examples of the aromatic amine (b) include imidazole, pyrrole, pyridine, pyridazine, pyrazine, purine, quinoline, and quinazoline. The aromatic amine may have a substituent, and examples of the substituent include substituents described for Formula (C-1).

Furthermore, two or more identical or different aliphatic amines, alicyclic amines, or aromatic amines may be bonded to form a polyamine such as a diamine or a triamine. The polyamine is preferably a polyamine in which aliphatic amines are bonded, and examples thereof include hexamethylenetetramine and polyethyleneimine (Epomin, Nippon Shokubai Co., Ltd.).

The cyclic amine (c) containing a condensed ring is a cyclic amine in which at least one nitrogen atom is contained in a ring skeleton forming a condensed ring; examples thereof include 1,8-diazabicyclo[5.4.0]undec-7-ene, 1,5-diazabicyclo[4.3.0]non-5-ene, and 1,4-diazabicyclo[2.2.2]octane.

Examples of the oxygen-containing amine (d) such as an amino acid, an amide, an alcoholamine, an ether amine, an imide, or a lactam include phthalimide, 2,5-piperazinedione, maleimide, caprolactam, pyrrolidone, morpholine, glycine, alanine, and phenylalanine.

In addition, (c) and (d) may have the substituent described for a compound represented by Formula (C-1), and among them an alkyl group having 1 to 6 carbon atoms is preferable.

As the amine compound in the present invention, (b) and (c) are preferable. As (b), an aliphatic amine is preferable, a polyamine of an aliphatic amine is more preferable, and polyethyleneimine is yet more preferable. As (c), 1,8-diazabicyclo[5.4.0]undec-7-ene is preferable.

From the viewpoint of film strength after thermal crosslinking, the amine preferably has a pKaH (an acid dissociation constant of the conjugate acid) of at least 7, and more preferably at least 10.

Among the above-mentioned acidic or basic catalysts, from the viewpoint of an alcohol exchange reaction progressing quickly in the film, methanesulfonic acid, p-toluenesulfonic acid, pyridinium p-toluenesulfonate, dodecylbenzenesulfonic acid, phosphoric acid, phosphonic acid, acetic acid, polyethyleneimine, 1,8-diazabicyclo[5.4.0]undec-7-ene, 1,5-diazabicyclo[4.3.0]non-5-ene, 1,1,3,3-tetramethylguanidine, and boron trifluoride monoethylamine complex are preferable, and phosphoric acid, polyethyleneimine, and 1,8-diazabicyclo[5.4.0]undec-7-ene are particularly preferable.

With regard to the crosslinking catalyst, only one type thereof may be used or two or more types thereof may be used in combination. The content of the crosslinking catalyst in the resin composition for laser engraving is preferably 0.01 to 20 wt % in the total non-volatile components, more preferably 0.1 to 10 wt %, and yet more preferably 0.5 to 3 wt %.

<(Component D) Plasticizer>

From the viewpoint of imparting flexibility to a relief layer, the resin composition for laser engraving of the present invention preferably further comprises (Component D) a plasticizer.

A plasticizer known as a polymer plasticizer may be used without limitations; examples thereof include, as described in pp. 211 to 220 of 'Kobunshi Daijiten (Polymer Dictionary)' (first edition, 1994, Maruzen Co., Ltd.), an adipic acid derivative, an azelaic acid derivative, a benzoylic acid derivative, a citric acid derivative, an epoxy derivative, a glycol derivative, a hydrocarbon and a derivative thereof, an oleic acid derivative, a phosphoric acid derivative, a phthalic acid derivative, a polyester system, a ricinoleic acid derivative, a sebacic acid derivative, a stearic acid derivative, a sulfonic acid derivative, a terpene and a derivative thereof, and a trimellitic acid derivative, and from the viewpoint of compatibility, a citric acid derivative, a hydrocarbon and a derivative thereof, and a phthalic acid derivative are preferable.

As the citric acid derivative, tributyl citrate and tri-n-butylacetyl citrate are preferable.

The hydrocarbon and the derivative thereof are preferably liquid at normal temperature (20° C.). Furthermore, from the viewpoint of prevention of evaporation in a coating/drying step and from the viewpoint of prevention of evaporation over time, one having a boiling point of 200° C. or greater is preferable. Specific examples thereof include a paraffin that is liquid at normal temperature (20° C.), and preferred examples include Shell Ondina Oil 15, 32, and 68 (Showa Shell Sekiyu K.K.).

The phthalic acid derivative is preferably a dialkyl phthalate ester. The alkyl group is preferably a straight-chain, branched, or cyclic alkyl group having no greater than 15 carbons, and more preferably an alkyl group having no greater than 10 carbons.

With regard to Component D, only one type thereof may be used or two or more types thereof may be used in combination. From the viewpoint of compatibility, the content of Component D contained in the resin composition for laser engraving is preferably no greater than 50 wt % in the total non-volatile components, more preferably 5 to 40 wt %, and yet more preferably 15 to 25 wt %.

<(Component E) Polymerizable Compound>

From the viewpoint of forming a crosslinked structure in a relief-forming layer, the resin composition for laser engraving of the present invention preferably further comprises (Component E) a polymerizable compound.

The polymerizable compound is preferably a radically polymerizable compound, and may be freely selected from compounds having at least one, preferably at least 2, more preferably 2 to 12, and yet more preferably 2 to 6 ethylenically unsaturated bonds. Furthermore, the polymerizable compound is a compound different from Component B, and is preferably a compound having an ethylenically unsaturated group at a molecular terminal.

Moreover, the polymerizable compound is preferably a compound for which the molecular weight (weight-average molecular weight) is less than 2,000, more preferably a compound for which it is no greater than 1,500, and yet more preferably a compound for which it is no greater than 1,000.

The polymerizable compound is not particularly limited; a known compound may be used, and examples thereof include those described in JP-A-2009-204962 paragraphs 0098 to 0124 and JP-A-2009-255510.

The polymerizable compound may have a chemical configuration such as a monomer, a prepolymer, that is, a dimer, a trimer, or an oligomer, a copolymer thereof, or a mixture thereof.

Examples of the monomer include an unsaturated carboxylic acid (e.g. acrylic acid, methacrylic acid, itaconic acid, crotonic acid, isocrotonic acid, maleic acid, etc.), an ester thereof, and an amide thereof. It is preferable to use an ester of an unsaturated carboxylic acid and an aliphatic polyhydric alcohol compound or an amide of an unsaturated carboxylic acid and an aliphatic polyvalent amine compound.

Furthermore, it is also desirable to use an addition reaction product of an unsaturated carboxylic acid ester or amide having a nucleophilic substituent such as a hydroxy group or an amino group with a monofunctional or polyfunctional isocyanate or epoxy, or a dehydration-condensation reaction product with a monofunctional or polyfunctional carboxylic acid.

It is also desirable to use an addition reaction product of an unsaturated carboxylic acid ester or amide having an electrophilic substituent such as an isocyanato group or an epoxy group with a monofunctional or polyfunctional alcohol or an amine, a substitution reaction product of an unsaturated carboxylic acid ester or amide having a leaving group such as a halogen atom or a tosyloxy group with a monofunctional or polyfunctional alcohol or amine. As another example, it is possible to use a group of compounds in which the above-mentioned unsaturated carboxylic acid is replaced by an unsaturated phosphonic acid, styrene, vinyl ether, etc.

Specific examples of a monomer that is an ester of an aliphatic polyhydric alcohol compound and an unsaturated carboxylic acid include ethylene glycol di(meth)acrylate, triethylene glycol di(meth)acrylate, 1,3-butanediol di(meth)acrylate, tetramethylene glycol di(meth)acrylate, propylene glycol di(meth)acrylate, glycerol di(meth)acrylate, glycerol tri(meth)acrylate, neopentyl glycol di(meth)acrylate, trimethylolpropane tri(meth)acrylate, trimethylolpropane tri((meth)acryloyloxypropyl) ether, trimethylolethane tri(meth)acrylate, hexanediol di(meth)acrylate, 1,4-cyclohexanediol di(meth)acrylate, tetraethylene glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate, tri((meth)acryloyloxyethyl) isocyanurate, and a polyester (meth)acrylate oligomer. Among them, one having a hydroxy group as a substituent is preferable, and glycerol di(meth)acrylate is more preferable.

Examples of other esters which are preferably used include aliphatic alcohol esters disclosed in, for example, JP-B-46-27926, JP-B-51-47334 (JP-B denotes a Japanese examined patent application publication), and JP-A-57-196231, those having an aromatic skeleton disclosed in JP-A-59-5240, JP-A-59-5241, and JP-A-2-226149, and those containing an amino group disclosed in JP-A-1-165613. The above-mentioned ester monomers may be used as a mixture.

Furthermore, a urethane-based addition-polymerizable compound produced by an addition reaction of an isocyanato group and a hydroxy group is also suitable, and specific examples thereof include a vinylurethane compound containing two or more polymerizable vinyl groups per molecule in which a hydroxy group-containing vinyl monomer represented by Formula (1) below is added to a polyisocyanate compound having two or more isocyanato groups per molecule described in JP-B-48-41708.

CH$_2$=C(R)COOCH$_2$CH(R')OH　　(i)

(R and R' independently denote H or CH$_3$.)

Furthermore, urethane acrylates described in JP-A-51-37193, JP-B-2-32293, and JP-B-2-16765, and urethane compounds having an ethylene oxide-based skeleton described in JP-B-58-49860, JP-B-56-17654, JP-B-62-39417, JP-B-62-39418 are also suitable.

Furthermore, by use of an addition-polymerizable compound having an amino structure in the molecule described in JP-A-63-277653, JP-A-63-260909, and JP-A-1-105238, a cured composition can be obtained in a short period of time.

Other examples include polyester acrylates such as those described in JP-A-48-64183, JP-B-49-43191, and JP-B-52-30490, and polyfunctional acrylates and methacrylates such as epoxy acrylates formed by a reaction of an epoxy resin and (meth)acrylic acid. Examples also include specific unsaturated compounds described in JP-B-46-43946, JP-B-1-40337, and JP-B-1-40336, and vinylphosphonic acid-based compounds described in JP-A-2-25493. In some cases, perfluoroalkyl group-containing structures described in JP-A-61-22048 are suitably used. Moreover, those described as photocuring monomers or oligomers in the Journal of the Adhesion Society of Japan, Vol. 20, No. 7, pp. 300 to 308 (1984) may also be used.

The oligomer in the present invention may be any oligomer, and examples thereof include an olefin-based oligomer (an ethylene oligomer, a propylene oligomer, a butene oligomer, etc.), a vinyl-based oligomer (a styrene oligomer, a vinyl alcohol oligomer, a vinylpyrrolidone oligomer, an acrylate oligomer, a methacrylate oligomer, etc.), a diene-based oligomer (a butadiene oligomer, a chloroprene rubber, a pentadiene oligomer, etc.), a ring-opening polymerization type oligomer (di-, tri-, tetra-ethylene glycol, polyethylene glycol, polyethylimine, etc.), an addition-polymerization type oligomer (an oligoester acrylate, a polyamide oligomer, a polyisocyanate oligomer), and an addition-condensation oligomer (a phenolic resin, an amino resin, a xylene resin, a ketone resin, etc.). Among them an oligoester (meth)acrylate is preferable, and among them a urethane (meth)acrylate, a polyester (meth)acrylate, and an epoxy (meth)acrylate are preferable, and a urethane (meth)acrylate is more preferable.

As the urethane (meth)acrylate, an aliphatic urethane (meth)acrylate and an aromatic urethane (meth)acrylate may preferably be cited. With respect to the oligomer, 'Origomar Handobukku (Oligomer Handbook)' (edited by Junji Furukawa, The Chemical Daily Co., Ltd.) may also be referred to.

As oligomer commercial products, examples of urethane (meth)acrylates include R1204, R1211, R1213, R1217, R1218, R1301, R1302, R1303, R1304, R1306, R1308, R1901, and R1150 manufactured by Dai-Ichi Kogyo Seiyaku Co., Ltd., the EBECRYL series (e.g. EBECRYL 230, 270, 4858, 8402, 8804, 8807, 8803, 9260, 1290, 1290K, 5129, 4842, 8210, 210, 4827, 6700, 4450, and 220) manufactured by Daicel-Cytec Company Ltd., NK Oligo U-4HA, U-6HA, U-15HA, U-108A, and U200AX manufactured by Shin-Nakamura Chemical Co., Ltd., and Aronix M-1100, M-1200, M-1210, M-1310, M-1600, and M-1960 manufactured by Toagosei Co., Ltd. Examples of polyester (meth)acrylates include the EBECRYL series (e.g. EBECRYL 770, IRR467, 81, 84, 83, 80, 675, 800, 810, 812, 1657, 1810, IRR302, 450, 670, 830, 870, 1830, 1870, 2870, IRR267, 813, IRR483, 811, etc.) manufactured by Daicel-Cytec Company Ltd. and Aronix M-6100, M-6200, M-6250, M-6500, M-7100, M-8030, M-8060, M-8100, M-8530, M-8560, and M-9050 manufactured by Toagosei Co., Ltd. Examples of epoxy (meth)acrylates include the EBECRYL series (e.g. EBECRYL 600, 860, 2958, 3105, 3411, 3600, 3605, 3700, 3701, 3703, 3702, 3708, RDX63182, 6040, etc.) manufactured by Daicel-Cytec Company Ltd.

From the viewpoint of flexibility and brittleness of a crosslinked relief-forming layer, the content of Component E in the resin composition for laser engraving of the present invention is preferably 0.5 to 50 wt % in the total non-volatile components, more preferably 2 to 40 wt %, and yet more preferably 5 to 30 wt %.

<(Component F) Polymerization Initiator>

The resin composition for laser engraving of the present invention preferably further comprises (Component F) a polymerization initiator. As the polymerization initiator, a radical polymerization initiator is preferable, and preferred examples thereof include compounds described in paragraphs 0074 to 0118 of JP-A-2008-63554.

Examples of the radical polymerization initiator include an aromatic ketone, an onium salt compound, an organic peroxide, a thio compound, a hexaarylbiimidazole compound, a ketoxime ester compound, a borate compound, an azinium compound, a metallocene compound, an active ester compound, a carbon-halogen bond-containing compound, and an azo-based compound. Among them, from the viewpoint of engraving sensitivity and good relief edge shape when applied to a relief-forming layer of a relief printing plate precursor, an organic peroxide and an azo-based compound are preferable, and an organic peroxide is particularly preferable.

Furthermore, as a compound that is preferably used in combination, since use of an organic peroxide and a photothermal conversion agent in combination greatly increases the engraving sensitivity, it is most preferable to employ a mode in which an organic peroxide and carbon black, which is a photothermal conversion agent, are used in combination.

This is because, when a relief-forming layer is cured by thermal crosslinking using a polymerizable compound and an organic peroxide, unreacted organic peroxide that is not involved in radical formation remains, but the remaining organic peroxide functions as a self-reactive additive and decomposes exothermically during laser engraving. It is surmised that, as a result, an amount corresponding to the heat generated is added to the irradiated laser energy, and the engraving sensitivity is thus increased.

This effect is outstanding when carbon black is used as a photothermal conversion agent. It is surmised that, as a result of heat generated from carbon black being transmitted to an organic peroxide, heat is generated not only from the carbon black but also from the organic peroxide, and thermal energy that is used for decomposition is generated synergistically.

With regard to the polymerization initiator, one type may be used on its own or two or more types may be used in combination.

The content of the polymerization initiator in the resin composition for laser engraving of the present invention is preferably 0.01 to 10 wt % relative to the total weight on a non-volatile component basis, and more preferably 0.1 to 3 wt %. When the content of the polymerization initiator is at least 0.01 wt %, an effect from the addition thereof is obtained, and crosslinking of a crosslinkable relief-forming layer proceeds promptly. Furthermore, when the content is no greater than 10 wt %, other components do not become insufficient, and printing durability that is satisfactory as a relief printing plate is obtained.

<(Component G) Inorganic Particles>

The resin composition for laser engraving of the present invention preferably further comprises (Component G) inorganic particles.

Adding inorganic particles enables mechanical properties such as viscosity of a resin composition for laser engraving, and wettability and viscoelastic properties of a relief-forming layer to be adjusted. Adding inorganic particles to the resin composition for laser engraving enables reduction in tackiness of the relief-forming layer surface, improvement of rinsing properties for engraving residue, and improvement of quality of printing by the relief printing plate to be realized. Furthermore, the use of inorganic particles enables the breaking strength of the relief-forming layer to be improved and a relief printing plate having excellent ink transfer properties to be obtained. Furthermore, inorganic particles may be added in order to improve the solvent resistance of the relief-forming layer obtained.

It is preferable, for the purpose of forming by a laser engraving method a pattern that exists on the surface of a relief-forming layer or pierces a relief-forming layer, to add porous inorganic particles having a number-average particle size of at least 5 nm but no greater than 10 µm or nonporous inorganic particles having a primary particle number-average particle size of at least 5 nm but no greater than 100 nm, both of which have excellent adsorptive removal properties for tacky liquid residue formed during laser engraving.

Here, 'porous inorganic particles' in the present invention means inorganic particles having a pore volume of at least 0.1 mL/g. In the present invention, pore volume is obtained from a nitrogen adsorption isotherm at −196° C. by a nitrogen adsorption method.

The pore volume of the porous inorganic particles is preferably in the range of 0.1 mL/g to 10 mL/g, and more preferably 0.2 mL/g to 5 mL/g. When porous inorganic particles having a pore volume of at least 0.1 mL/g are used, the amount of adsorption of tacky liquid residue formed during laser engraving becomes sufficient. When the pore volume is no greater than 10 mL/g, it is possible to ensure that the porous inorganic particles have mechanical strength.

The number-average particle size of the porous inorganic particles is preferably at least 100 nm but no greater than 10 µm, and more preferably at least 300 nm but no greater than 5 µm.

The porous inorganic particles are not particularly limited, but examples thereof include porous silica, mesoporous silica, silica-zirconia porous gel, porous alumina, porous glass, and zeolite.

With regard to the porous inorganic particles, one type thereof or two or more types thereof in combination may be used.

Here, 'nonporous inorganic particles' in the present invention means microparticles having a pore volume of less than 0.1 mL/g.

The number-average particle size of the nonporous inorganic particles is preferably 10 nm to 100 nm, and more preferably 10 nm to 50 nm.

As a material for the nonporous inorganic particles, for example, at least one type selected from alumina, silica, zirconium oxide, barium titanate, strontium titanate, titanium oxide, silicon nitride, boron nitride, silicon carbide, chromium oxide, vanadium oxide, tin oxide, bismuth oxide, germanium oxide, aluminum borate, nickel oxide, molybdenum oxide, tungsten oxide, iron oxide, and cerium oxide is preferably contained as a main component.

The nonporous inorganic particles are preferably nonporous inorganic particles produced using the above-mentioned material by any one of a flame hydrolysis method, an arc method, a plasma method, a precipitation method, a gelling method, and a molten solid method. The flame hydrolysis method, the arc method, and the plasma method are also called thermal decomposition methods or high temperature methods (dry methods). The precipitation method and the gelling method are also called wet methods. Among them, a dry method and, in particular, a flame hydrolysis method is preferable.

With regard to the nonporous inorganic particles, one type or two or more types thereof in combination may be used, and they may be used in combination with the porous inorganic particles.

When porous or nonporous inorganic particles having a number-average particle size in the above-mentioned range are used, there are no problems such as increase in viscosity, inclusion of bubbles, or formation of a large amount of dust, and the surface of a relief-forming layer will not have unevenness.

The number-average particle size of inorganic particles may be measured using a laser-scattering type particle size distribution analyzer.

The particle shape of the inorganic particles is not particularly limited, and particles having a spherical form, a flat form, an acicular form, an amorphous form, or projections on the surface may be used. From the viewpoint of abrasion resistance in particular, spherical particles are preferable.

It is also possible to subject the surface of inorganic particles to a surface modification treatment by coating with a silane coupling agent, a titanium coupling agent, or another organic compound, thus making particles hydrophilic or hydrophobic. With regard to these inorganic particles, one type or two or more types thereof may be selected.

When inorganic particles are used in the resin composition for laser engraving of the present invention, from the viewpoint of a balance being achieved between removability of residue and film flexibility, the content of the inorganic particles is preferably 0.01 to 30 wt % in the total non-volatile components of the resin composition for laser engraving, more preferably 0.05 to 15 wt %, and yet more preferably 0.1 to 5 wt %.

<(Component H) Photothermal Conversion Agent>

The resin composition for laser engraving of the present invention preferably comprises (Component H) a photothermal conversion agent. It is surmised that the photothermal conversion agent absorbs laser light and generates heat thus promoting thermal decomposition of a cured material of the resin composition for laser engraving of the present invention during laser engraving. Because of this, it is preferable to select a photothermal conversion agent that absorbs light having the wavelength of the laser that is used for engraving.

When a laser (a YAG laser, a semiconductor laser, a fiber laser, a surface emitting laser, etc.) emitting infrared at a wavelength of 700 nm to 1,300 nm is used as a light source for laser engraving, it is preferable for the relief-forming layer in the present invention to comprise a photothermal conversion agent that can absorb light having a wavelength of 700 nm to 1,300 nm.

As the photothermal conversion agent in the present invention, various types of dye or pigment are used.

With regard to the photothermal conversion agent, examples of dyes that can be used include commercial dyes and known dyes described in publications such as 'Senryo Binran' (Dye Handbook) (Ed. by The Society of Synthetic Organic Chemistry, Japan, 1970). Specific examples include dyes having a maximum absorption wavelength at 700 nm to 1,300 nm, such as azo dyes, metal complex salt azo dyes, pyrazolone azo dyes, naphthoquinone dyes, anthraquinone dyes, phthalocyanine dyes, carbonium dyes, diimmonium compounds, quinone imine dyes, methine dyes, cyanine dyes, squarylium colorants, pyrylium salts, and metal thiolate complexes. In particular, cyanine-based colorants such as heptamethine cyanine colorants, oxonol-based colorants such as pentamethine oxonol colorants, phthalocyanine-based colorants, and dyes described in paragraphs 0124 to 0137 of JP-A-2008-63554 are preferably used.

With regard to the photothermal conversion agent used in the present invention, examples of pigments include commercial pigments and pigments described in the Color Index (C.I.) Handbook, 'Saishin Ganryo Binran' (Latest Pigments Handbook) (Ed. by Nippon Ganryo Gijutsu Kyokai, 1977), 'Saisin Ganryo Ouyogijutsu' (Latest Applications of Pigment Technology) (CMC Publishing, 1986), 'Insatsu Inki Gijutsu' (Printing Ink Technology) (CMC Publishing, 1984). Examples include pigments described in paragraphs 0122 to 0125 of JP-A-2009-178869. Among these pigments, carbon black is preferable.

Any carbon black, regardless of classification by ASTM (American Society for Testing and Materials) and application (e.g. for coloring, for rubber, for dry cell, etc.), may be used as long as dispersibility, etc. in the composition is stable. Carbon black includes for example furnace black, thermal black, channel black, lamp black, and acetylene black. In order to make dispersion easy, a black colorant such as carbon black may be used as color chips or a color paste by dispersing it in nitrocellulose or a binder in advance of using, as necessary, a dispersant, and such chips and paste are readily available as commercial products. Examples include carbon black include described in paragraphs 0130 to 0134 in JP-A-2009-178869.

The content of the photothermal conversion agent in the resin composition for laser engraving of the present invention largely depends on the size of the molecular extinction coefficient characteristic to the molecule, and is preferably 0.01 to 30 wt % relative to the total weight on a non-volatile component basis of the resin composition, more preferably 0.05 to 20 wt %, and yet more preferably 0.1 to 10 wt %.

<(Component I) Fragrance>

In order to reduce odor, the resin composition for laser engraving of the present invention preferably comprises (Component I) a fragrance. A fragrance is effective in reducing odor when producing a relief printing plate precursor or when carrying out laser engraving.

When the resin composition for laser engraving of the present invention comprises (Component I) a fragrance, the odor of solvent evaporating when drying a liquid-form resin composition coated during production can be masked. Furthermore, unpleasant smell such as amine odor, ketone odor, aldehyde odor, or the foul burning smell of resin occurring when carrying out laser engraving can be masked.

Furthermore, since a fragrance is also effective in reducing the odor of sulfur, it is useful in the resin composition of the present invention comprising a sulfur atom-containing compound.

As the fragrance, a known fragrance may be used by appropriate selection; one type of fragrance may be used on its own, or a plurality of fragrances may be used in combination.

The fragrance is preferably selected as appropriate according to the silane compound of Component A used in the resin composition, and it is preferable to carry out optimization by combining known fragrances. Examples of the fragrance include fragrances described in 'Gosei Koryo—Kagaku To Shohin Chishiki—(Synthetic Fragrances—Chemistry and Product Knowledge—)' (Motoichi Indo, The Chemical Daily Co., Ltd.), 'Koryo Kagaku Nyumon (Introduction to Fragrance Chemistry)' (Shoji Watanabe, Baifukan), 'Kaori no Hyakka' (Encyclopedia of Fragrances) (Ed. by Japan Perfumery & Flavoring Association, Asakura Publishing Co., Ltd.), and 'Koryo Kagaku Soran II (Complete Fragrance Chemistry II) Isolated Fragrances/Synthetic Fragrances/Applications of Fragrances' (Hirokawa-Shoten Ltd.).

Furthermore, examples of fragrances that can be used in the present invention include fragrances described in paragraphs 0012 to 0025 of JP-A-2009-203310.

Among them, it is preferable to use as the fragrance a terpene compound such as a terpene-based hydrocarbon, a terpene-based alcohol, a terpene oxide, a terpene-based aldehyde, a terpene-based ketone, a terpene-based carboxylic acid, a terpene-based lactone, or a terpene-based carboxylate ester and/or an ester compound such as an aliphatic ester, a furan-based carboxylate ester, an alicyclic carboxylate ester, a cyclohexylcarboxylate ester, or an aromatic carboxylate ester.

Furthermore, it is preferable to use a heat-resistant fragrance as the fragrance in the present invention. In accordance with the use of a heat-resistant fragrance, it is possible to mask bad odor due to decomposition of resin by releasing an aroma during laser engraving and, moreover, to give a (crosslinked) relief-forming layer and relief layer that can be stored for a long period of time while releasing hardly any aroma at normal temperature (20° C.).

The heat-resistant fragrance referred to here means a fragrance that masks bad odor due to decomposition of resin, etc.

by releasing an aroma during a laser engraving operation and that can be stored for a long period of time while releasing hardly any aroma at normal temperature.

As the heat-resistant fragrance, specifically, one or more types selected from the group consisting of the heliotrope-based, jasmine-based, rose-based, orange flower-based, amber-based, and musk-based fragrance components shown below are preferably used.

Furthermore, as a specific fragrance, there is a TABU type fragrance formed by superimposing, on an oriental base below containing patchouli oil as a main body, one selected from the group consisting of rose-based, amber-based, musk-based, and jasmine-based fragrance components below together with a dioctyl phthalate (DOP) solvent.

Oriental base: patchouli oil, Hercolyn (methyl abietate), vanillin, ethyl vanillin, coumarin Rose-based fragrance component: phenylethyl alcohol, geraniol, isobornyl methoxycyclohexanol Amber-based fragrance component: tetrahydroparamethylquinoline Musk-based fragrance component: galaxolide, musk ketone Jasmine-based fragrance component: α-amylcinnamaldehyde, methyl dihydrojasmonate Moreover, an amethyst type fragrance having a heliotrope-based fragrance component below as a main fragrance note, a jasmine-based fragrance component and, furthermore, a rose-based fragrance component or an orange flower-based fragrance component in order to impart a top note and diffusibility together with a DOP solvent can be cited as a preferred example.

Heliotrope-based fragrance component: heliotropin, coumarin, ethyl vanillin, acetyl cedrene, Hercolyn (methyl abietate), eugenol, methyl ionone Rose-based fragrance component: damascone-β, damascone-α, isobornyl methoxycyclohexanol Orange flower-based fragrance component: methyl anthranilate, γ-undecalactone, γ-nonalactone Jasmine-based fragrance component: methyl dihydrojasmonate.

Furthermore, as another heat-resistant fragrance, a 6-hydroxyalkanoic acid or a 6-(5- and/or 6-alkenoyloxy)alkanoic acid may be preferably used.

The fragrance that can be used in the present invention preferably comprises at least a vanillin-based fragrance, a jasmine-based fragrance, or a mint-based fragrance, more preferably comprises a vanillin-based fragrance or a jasmine-based fragrance, and yet more preferably comprises a vanillin-based fragrance.

Furthermore, the fragrance in the resin composition of the present invention is preferably a vanillin-based fragrance, a jasmine-based fragrance, or a mint-based fragrance.

Specific preferred examples of the vanillin-based fragrance include vanillin, vanillic acid, vanillyl alcohol, vanillin propylene glycol acetal, methyl vanillin, ethyl vanillin, parahydroxybenzoic acid, and parahydroxybenzaldehyde.

Specific preferred examples of the jasmine-based fragrance include methyl dihydrojasmonate, methyl epi-dihydrojasmonate, methyl jasmonate, methyl epi-jasmonate, cis-jasmone, jasmonan, cis-jasmone lactone, dihydrojasmone lactone, jasmine lactone, γ-jasmolactone, cis-jasmone lactone, methyl γ-decalactone, jasmolactone, γ-hexylactone, γ-octalactone, γ-nonalactone, 4-methyl-5-hexenolide-1:4,2-n-hexylcyclopentanone, and alkyl cycloheptylmethylcarbonate.

Specific preferred examples of the mint-based fragrance include menthol, menthone, cineole, l-menthol, d-menthol, dl-menthol, d-neomenthol, d-isomenthol, peppermint oil, spearmint oil, and mint oil.

The content of the fragrance is preferably 0.003 to 1.5 wt % relative to the total weight on a non-volatile component basis of the resin composition, and more preferably 0.005 to 1.0 wt %. When in the above-mentioned range, a masking effect can be exhibited fully, the odor of the fragrance is appropriate, the operating environment can be improved, and engraving sensitivity is excellent.

<Other Additives>

The resin composition for laser engraving of the present invention may comprise as appropriate various types of additives that are usually used in the rubber field as long as the effects of the present invention are not inhibited. Examples include a filler, a wax, a process oil, an organic acid, a metal oxide, an antiozonant, an anti-aging agent, a thermopolymerization inhibitor, and a colorant, and one type thereof may be used on its own or two more types may be used in combination.

(Relief Printing Plate Precursor for Laser Engraving)

The relief printing plate precursor for laser engraving of the present invention comprises above a support, as a crosslinked relief-forming layer, a thermally crosslinked layer of a resin composition for laser engraving that comprises (Component A) a compound containing a hydrolyzable silyl group and/or a silanol group and that does not comprise (Component B) a binder polymer or comprises it at less than 2 wt % relative to the total weight on a non-volatile component basis.

In the present invention, the 'relief-forming layer' means a layer in a state before being crosslinked. That is, it is a layer formed from the resin composition for laser engraving of the present invention, which may be dried as necessary. In the present invention, the 'crosslinked relief-forming layer' means a layer formed by crosslinking the relief-forming layer. The crosslinking is carried out by means of heat. Furthermore, the crosslinking is not particularly limited as long as it is a reaction by which the resin composition for laser engraving is cured, and it is a concept that includes a structure crosslinked due to reaction between components A or between components E, but it is preferable to form a crosslinked structure by a reaction between Component A and Component E. The 'relief printing plate' is prepared by laser-engraving a relief printing plate precursor for laser engraving having a crosslinked relief-forming layer. Moreover, in the present invention, the 'relief layer' means the crosslinked relief-forming layer after laser engraving.

The relief printing plate precursor for laser engraving of the present invention has a relief-forming layer formed from a resin composition for laser engraving comprising the above-mentioned components. The (crosslinked) relief-forming layer is preferably provided above a support.

The relief printing plate precursor for laser engraving may further comprise, as necessary, an adhesive layer between the support and the (crosslinked) relief-forming layer and, above the (crosslinked) relief-forming layer, a slip coat layer and a protection film.

<Relief-Forming Layer>

The relief-forming layer is a layer formed from the resin composition for laser engraving, and is a thermally crosslinkable layer. The relief printing plate precursor for laser engraving of the present invention preferably comprises a relief-forming layer to which further crosslinkable function is imparted by it further comprising (Component E) a polymerizable compound and (Component F) a polymerization initiator in addition to a crosslinked structure between Components A themselves.

As a mode in which a relief printing plate is prepared using the relief printing plate precursor for laser engraving, a mode in which a relief printing plate is prepared by crosslinking a relief-forming layer to thus form a relief printing plate precursor having a crosslinked relief-forming layer, and the crosslinked relief-forming layer (hard relief-forming layer) is then laser-engraved to thus form a relief layer is preferable.

By crosslinking the relief-forming layer, it is possible to prevent abrasion of the relief layer during printing, and it is possible to obtain a relief printing plate having a relief layer with a sharp shape after laser engraving.

The relief-forming layer may be formed by molding the resin composition for laser engraving into a sheet shape or a sleeve shape. The relief-forming layer is usually provided above a support, which is described later, but it may be formed directly on the surface of a member such as a cylinder of equipment for plate making or printing or may be placed and immobilized thereon, and a support is not always required.

A case in which the relief-forming layer is mainly formed in a sheet shape is explained as an Example below.

<Support>

A material used for the support of the relief printing plate precursor for laser engraving is not particularly limited, but one having high dimensional stability is preferably used, and examples thereof include metals such as steel, stainless steel, or aluminum, plastic resins such as a polyester (e.g. polyethylene terephthalate (PET), polybutylene terephthalate (PBT), or polyacrylonitrile (PAN)) or polyvinyl chloride, synthetic rubbers such as styrene-butadiene rubber, and glass fiber-reinforced plastic resins (epoxy resin, phenolic resin, etc.). As the support, a PET film or a steel substrate is preferably used. The configuration of the support depends on whether the relief-forming layer is in a sheet shape or a sleeve shape.

<Adhesive Layer>

An adhesive layer may be provided between the relief-forming layer and the support for the purpose of strengthening the adhesion between the two layers.

Examples of materials (adhesives) that can be used in the adhesive layer include those described in 'Handbook of Adhesives', Second Edition, Ed by I. Skeist, (1977).

<Protection Film, Slip Coat Layer>

For the purpose of preventing scratches or dents in the relief-forming layer surface or the crosslinked relief-forming layer surface, a protection film may be provided on the relief-forming layer surface or the crosslinked relief-forming layer surface. The thickness of the protection film is preferably 25 to 500 µm, and more preferably 50 to 200 µm. The protection film may employ, for example, a polyester-based film such as PET or a polyolefin-based film such as PE (polyethylene) or PP (polypropylene). The surface of the film may be made matte. The protection film is preferably peelable.

When the protection film is not peelable or conversely has poor adhesion to the relief-forming layer, a slip coat layer may be provided between the two layers. The material used in the slip coat layer preferably employs as a main component a resin that is soluble or dispersible in water and has little tackiness, such as polyvinyl alcohol, polyvinyl acetate, partially saponified polyvinyl alcohol, a hydroxyalkylcellulose, an alkylcellulose, or a polyamide resin.

(Process for Producing Relief Printing Plate Precursor for Laser Engraving)

Formation of a relief-forming layer in the relief printing plate precursor for laser engraving is not particularly limited, and examples thereof include a method in which the resin composition for laser engraving is prepared, solvent is removed from this coating solution composition for laser engraving, and it is melt-extruded onto a support. Alternatively, a method may be employed in which the resin composition for laser engraving is cast onto a support, and this is dried in an oven to thus remove solvent from the resin composition.

Among them, the process for producing a relief printing plate precursor for laser engraving of the present invention is preferably a production process comprising a layer formation step of forming a relief-forming layer from the resin composition for laser engraving of the present invention and a crosslinking step of crosslinking the relief-forming layer by means of heat to thus obtain a relief printing plate precursor having a crosslinked relief-forming layer.

Subsequently, as necessary, a protection film may be laminated on the crosslinked relief-forming layer. Laminating may be carried out by compression-bonding the protection film and the crosslinked relief-forming layer by means of heated calendar rollers, etc. or putting a protection film into intimate contact with a crosslinked relief-forming layer whose surface is impregnated with a small amount of solvent.

When a protection film is used, a method in which a relief-forming layer is first layered on a protection film and a support is then laminated may be employed.

When an adhesive layer is provided, it may be dealt with by use of a support coated with an adhesive layer. When a slip coat layer is provided, it may be dealt with by use of a protection film coated with a slip coat layer.

<Layer Formation Step>

The process for making a relief printing plate for laser engraving of the present invention preferably comprises a layer formation step of forming a relief-forming layer from the resin composition for laser engraving of the present invention.

Preferred examples of a method for forming the relief-forming layer include a method in which the resin composition for laser engraving of the present invention is prepared, solvent is removed as necessary from this resin composition for laser engraving, and it is then melt-extruded onto a support and a method in which the resin composition for laser engraving of the present invention is prepared, the resin composition for laser engraving of the present invention is cast onto a support, and this is dried in an oven to thus remove solvent.

The resin composition for laser engraving may be produced by, for example, dissolving Component A, Component B, and as optional components such as Component C to Component I, etc. in an appropriate solvent, and then dissolving. Since it is necessary to remove most of the solvent component in a stage of producing a relief printing plate precursor, it is preferable to use as the solvent a volatile low-molecular-weight alcohol (e.g. methanol, ethanol, n-propanol, isopropanol, propylene glycol monomethyl ether), etc., and adjust the temperature, etc. to thus reduce as much as possible the total amount of solvent to be added.

In addition, in the present invention, since the amount of binder polymer (Component B) used is small, it is possible to form a film without using a solvent, even at low temperature. The amount of solvent used is preferably no greater than 30 parts by weight relative to 100 parts by weight of the nonvolatile components of the resin composition for laser engraving, and more preferably no greater than 20 parts by weight.

The thickness of the (crosslinked) relief-forming layer in the relief printing plate precursor for laser engraving before and after crosslinking is preferably at least 0.05 mm but no greater than 10 mm, more preferably at least 0.05 mm but no greater than 7 mm, and yet more preferably at least 0.05 mm but no greater than 3 mm.

<Crosslinking Step>

The process for making a relief printing plate for laser engraving of the present invention is preferably a production process that comprises a crosslinking step of thermally crosslinking the relief-forming layer to thus obtain a relief printing plate precursor having a crosslinked relief-forming layer. The relief-forming layer may be crosslinked by heating the relief printing plate precursor for laser engraving (step of crosslinking by means of heat). As heating means for carrying out crosslinking by heat, there can be cited a method in which a printing plate precursor is heated in a hot air oven or a far-infrared oven for a predetermined period of time and a method in which it is put into contact with a heated roller for a predetermined period of time.

Due to the relief-forming layer being thermally crosslinked, firstly, a relief formed after laser engraving becomes sharp and, secondly, tackiness of engraving residue formed during laser engraving is suppressed.

(Relief Printing Plate and Process for Making Same)

The process for making a relief printing plate of the present invention preferably comprises a step of preparing the relief printing plate precursor for laser engraving, and a step of forming a relief layer by laser-engraving the crosslinked relief-forming layer (engraving step).

The relief printing plate of the present invention is a relief printing plate made by the process for making a relief printing plate of the present invention.

The process for making a relief printing plate of the present invention preferably comprises a layer formation step of forming a relief-forming layer from the resin composition for laser engraving of the present invention, a crosslinking step of crosslinking the relief-forming layer by means of heat to thus obtain a relief printing plate precursor having a crosslinked relief-forming layer, and an engraving step of laser-engraving the relief printing plate precursor having the crosslinked relief-forming layer.

The relief printing plate of the present invention may suitably employ an aqueous ink when printing.

The layer formation step and the crosslinking step in the process for making a relief printing plate of the present invention mean the same as the layer formation step and the crosslinking step in the above-mentioned process for producing a relief printing plate precursor for laser engraving, and preferred ranges are also the same.

<Engraving Step>

The process for producing a relief printing plate of the present invention preferably comprises an engraving step of laser-engraving the relief printing plate precursor having a crosslinked relief-forming layer.

The engraving step is a step of laser-engraving a crosslinked relief-forming layer that has been crosslinked in the crosslinking step to thus form a relief layer. Specifically, it is preferable to engrave a crosslinked relief-forming layer that has been crosslinked by irradiation with laser light according to a desired image, thus forming a relief layer. Furthermore, a step in which a crosslinked relief-forming layer is subjected to scanning irradiation by controlling a laser head using a computer in accordance with digital data of a desired image can preferably be cited.

This engraving step preferably employs an infrared laser. When irradiated with an infrared laser, molecules in the crosslinked relief-forming layer undergo molecular vibration, thus generating heat. When a high power laser such as a carbon dioxide laser or a YAG laser is used as the infrared laser, a large quantity of heat is generated in the laser-irradiated area, and molecules in the crosslinked relief-forming layer undergo molecular scission or ionization, thus being selectively removed, that is, engraved. The advantage of laser engraving is that, since the depth of engraving can be set freely, it is possible to control the structure three-dimensionally. For example, for an area where fine halftone dots are printed, carrying out engraving shallowly or with a shoulder prevents the relief from collapsing due to printing pressure, and for a groove area where a fine outline character is printed, carrying out engraving deeply makes it difficult for ink the groove to be blocked with ink, thus enabling breakup of an outline character to be suppressed.

In particular, when engraving is carried out using an infrared laser that corresponds to the absorption wavelength of the photothermal conversion agent, it becomes possible to selectively remove the crosslinked relief-forming layer at higher sensitivity, thus giving a relief layer having a sharp image.

As the infrared laser used in the engraving step, from the viewpoint of productivity, cost, etc., a carbon dioxide laser ($CO_2$ laser) or a semiconductor laser is preferable. In particular, a fiber-coupled semiconductor infrared laser (FC-LD) is preferably used. In general, compared with a $CO_2$ laser, a semiconductor laser has higher efficiency laser oscillation, is less expensive, and can be made smaller. Furthermore, it is easy to form an array due to the small size. Moreover, the shape of the beam can be controlled by treatment of the fiber.

With regard to the semiconductor laser, one having a wavelength of 700 to 1,300 nm may be used, but one having a wavelength of 800 to 1,200 nm is preferable, one having a wavelength of 860 to 1,200 nm is more preferable, and one having a wavelength of 900 to 1,100 nm is particularly preferable.

Furthermore, the fiber-coupled semiconductor laser can output laser light efficiently by being equipped with optical fiber, and this is effective in the engraving step in the present invention. Moreover, the shape of the beam can be controlled by treatment of the fiber. For example, the beam profile may be a top hat shape, and energy can be applied stably to the plate face. Details of semiconductor lasers are described in 'Laser Handbook $2^{nd}$ Edition' (The Laser Society of Japan), 'Jitsuyo Laser Gijutsu' (Applied Laser Technology) (The Institute of Electronics and Communication Engineers), etc.

Moreover, as plate making equipment comprising a fiber-coupled semiconductor laser that can be used suitably in the process for making a relief printing plate employing the relief printing plate precursor of the present invention, those described in detail in JP-A-2009-172658 and JP-A-2009-214334 can be cited.

The process for making a relief printing plate of the present invention may as necessary further comprise, subsequent to the engraving step, a rinsing step, a drying step, and/or a post-crosslinking step, which are shown below.

Rinsing step: a step of rinsing the engraved surface by rinsing the engraved relief layer surface with water or a liquid containing water as a main component.

Drying step: a step of drying the engraved relief layer.

Post-crosslinking step: a step of further crosslinking the relief layer by applying energy to the engraved relief layer.

After the above-mentioned engraving step, since engraving residue is attached to the engraved surface, a rinsing step of washing off engraving residue by rinsing the engraved surface with water or a liquid containing water as a main component may be added. Examples of rinsing means include a method in which washing is carried out with tap water, a method in which high pressure water is spray-jetted, and a method in which the engraved surface is brushed in the presence of mainly water using a batch or conveyor brush type washout machine known as a photosensitive resin letterpress plate processor, and when slime due to engraving residue cannot be eliminated, a rinsing liquid to which a soap or a surfactant is added may be used.

When the rinsing step of rinsing the engraved surface is carried out, it is preferable to add a drying step of drying an engraved relief-forming layer so as to evaporate rinsing liquid.

Furthermore, as necessary, a post-crosslinking step for further crosslinking the relief-forming layer may be added. By carrying out a post-crosslinking step, which is an additional crosslinking step, it is possible to further strengthen the relief formed by engraving.

The pH of the rinsing liquid that can be used in the present invention is preferably at least 9, more preferably at least 10, and yet more preferably at least 11. The pH of the rinsing liquid is preferably no greater than 14, more preferably no greater than 13.3, and yet more preferably no greater than 13, and most preferably no greater than 12.5. When in the above-mentioned range, handling is easy.

In order to set the pH of the rinsing liquid in the above-mentioned range, the pH may be adjusted using an acid and/or a base as appropriate, and the acid or base used is not particularly limited.

The rinsing liquid that can be used in the present invention preferably comprises water as a main component.

The rinsing liquid may contain as a solvent other than water a water-miscible solvent such as an alcohol, acetone, or tetrahydrofuran.

The rinsing liquid preferably comprises a surfactant. From the viewpoint of removability of engraving residue and little influence on a relief printing plate, preferred examples of the surfactant that can be used in the present invention include betaine compounds (amphoteric surfactants) such as a carboxybetaine compound, a sulfobetaine compound, a phosphobetaine compound, an amine oxide compound, and a phosphine oxide compound.

The betaine compound is preferably a compound represented by Formula (1) below and/or a compound represented by Formula (2) below.

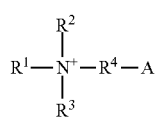

(1)

(In Formula (1), $R^1$ to $R^3$ independently denote a monovalent organic group, $R^4$ denotes a single bond or a divalent linking group, A denotes $PO(OR^5)O^-$, $OPO(OR^5)O^-$, $O^-$, $COO^-$, or $SO_3^-$, $R^5$ denotes a hydrogen atom or a monovalent organic group, and two or more groups of $R^1$ to $R^3$ may be bonded to each other to form a ring.)

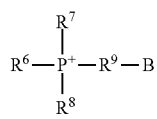

(2)

(In Formula (2), $R^6$ to $R^8$ independently denote a monovalent organic group, $R^9$ denotes a single bond or a divalent linking group, B denotes $PO(OR^{10})O^-$, $OPO(OR^{10})O^-$, $O^-$, $COO^-$, or $SO_3^-$, $R^{10}$ denotes a hydrogen atom or a monovalent organic group, and two or more groups of $R^6$ to $R^8$ may be bonded to each other to form a ring.)

The compound represented by Formula (1) above or the compound represented by Formula (2) above is preferably a carboxybetaine compound, a sulfobetaine compound, a phosphobetaine compound, an amine oxide compound, or a phosphine oxide compound. In the present invention, the structures of N=O of an amine oxide compound and P=O of a phosphine oxide compound are considered to be $N^+$—$O^-$ and $P^+$—$O^-$ respectively.

$R^1$ to $R^3$ in Formula (1) above independently denote a monovalent organic group. Two or more groups of $R^1$ to $R^3$ may be bonded to each other to form a ring, but it is preferable that no ring is formed.

The monovalent organic group denoted by $R^1$ to $R^3$ is not particularly limited, but is preferably an alkyl group, a hydroxy group-containing alkyl group, an alkyl group having an amide bond in an alkyl chain, or an alkyl group having an ether bond in an alkyl chain, and is more preferably an alkyl group, a hydroxy group-containing alkyl group, or an alkyl group having an amide bond in an alkyl chain.

Furthermore, the alkyl group as the monovalent organic group may have a straight chain, branched, or cyclic structure.

Moreover, it is particularly preferable that two of $R^1$ to $R^3$ are methyl groups, that is, a compound represented by Formula (1) has an N,N-dimethyl structure. When it has the above-mentioned structure, particularly good rinsing properties are exhibited.

$R^4$ in Formula (1) above denotes a single bond or a divalent linking group, and is a single bond when a compound represented by Formula (1) is an amine oxide compound.

The divalent linking group denoted by $R^4$ is not particularly limited, and is preferably an alkylene group or a hydroxy group-containing alkylene group, more preferably an alkylene group having 1 to 8 carbon atoms or a hydroxy group-containing alkylene group having 1 to 8 carbon atoms, and yet more preferably an alkylene group having 1 to 3 carbon atoms or a hydroxy group-containing-alkylene group having 1 to 3 carbon atoms.

A in Formula (1) above denotes $PO(OR^5)O^-$, $OPO(OR^5)O^-$, $O^-$, $COO^-$, or $SO_3^-$, and is preferably $O^-$, $COO^-$, or $SO_3^-$, and more preferably $COO^-$.

When A is $O^-$, $R^4$ is preferably a single bond.

$R^5$ in $PO(OR^5)O^-$ and $OPO(OR^5)O^-$ denotes a hydrogen atom or a monovalent organic group, and is preferably a hydrogen atom or an alkyl group having one or more unsaturated fatty acid ester structures.

Furthermore, $R^4$ is preferably a group that does not have $PO(OR^5)O^-$, $OPO(OR^5)O^-$, $O^-$, $COO^-$, or $SO_3^-$.

$R^6$ to $R^8$ in Formula (2) above independently denote a monovalent organic group. Two or more groups of $R^6$ to $R^8$ may be bonded to each other to form a ring, but it is preferable that no ring is formed.

The monovalent organic group denoted by $R^6$ to $R^8$ is not particularly limited, but is preferably an alkyl group, an alkenyl group, an aryl group, or a hydroxy group, and more preferably an alkenyl group, an aryl group, or a hydroxy group.

Furthermore, the alkyl group as the monovalent organic group may have a straight chain, branched, or cyclic structure.

It is particularly preferable that two of $R^6$ to $R^8$ are aryl groups.

$R^9$ in Formula (2) above denotes a single bond or a divalent linking group, and is a single bond when a compound represented by Formula (2) is a phosphine oxide compound.

The divalent linking group denoted by $R^9$ is not particularly limited, but is preferably an alkylene group or a hydroxy group-containing alkylene group, more preferably an alkylene group having 1 to 8 carbon atoms or a hydroxy group-containing alkylene group having 1 to 8 carbon atoms, and yet more preferably an alkylene group having 1 to 3 carbon atoms or a hydroxy group-containing alkylene group having 1 to 3 carbon atoms.

B in Formula (2) above denotes $PO(OR^{16})O^-$, $OPO(OR^{10})O^-$, $O^-$, $COO^-$, or $SO_3^-$, and is preferably $O^-$.

$R^9$ is preferably a single bond when B is $O^-$.

$R^{10}$ in $PO(OR^{10})O^-$ and $OPO(OR^{10})O^-$ denotes a hydrogen atom or a monovalent organic group, and is preferably a hydrogen atom or an alkyl group having one or more unsaturated fatty acid ester structures.

Furthermore, $R^9$ is preferably a group that does not have $PO(OR^{10})O^-$, $OPO(OR^{10})O^-$, $O^-$, $COO^-$, or $SO_3^-$.

A compound represented by Formula (1) is preferably a compound represented by Formula (3) below.

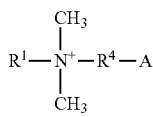

(3)

(In Formula (3), $R^1$ denotes a monovalent organic group, $R^4$ denotes a single bond or a divalent linking group, A denotes $PO(OR^5)O^-$, $OPO(OR^5)O^-$, $O^-$, $COO^-$, or $SO_3^-$, and $R^5$ denotes a hydrogen atom or a monovalent organic group.)

$R^1$, A, and $R^5$ in Formula (3) have the same meanings as $R^1$, A, and $R^5$ in Formula (1) above, and preferred ranges are also the same.

A compound represented by Formula (2) is preferably a compound represented by Formula (4) below.

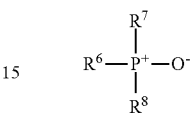

(4)

(In Formula (4), $R^6$ to $R^8$ independently denote an alkyl group, an alkenyl group, an aryl group, or a hydroxy group. In addition, not all of $R^6$ to $R^8$ are the same groups.)

$R^6$ to $R^8$ in Formula (4) above independently denote an alkyl group, an alkenyl group, an aryl group, or a hydroxy group, and are preferably an alkenyl group, an aryl group, or a hydroxy group.

Specific examples of the compound represented by Formula (1) and the compound represented by Formula (2) include the compounds below.

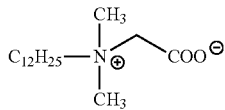
(1-A)

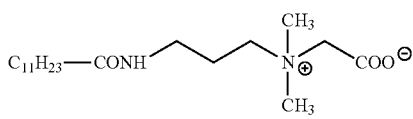
(1-B)

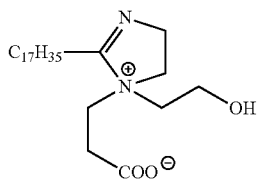
(1-C)

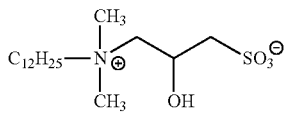
(1-D)

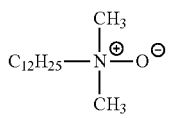
(1-E)

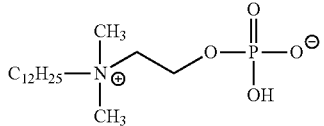
(1-F)

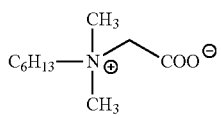
(1-G)

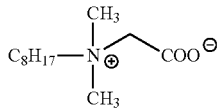
(1-H)

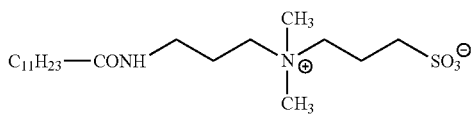
(1-I)

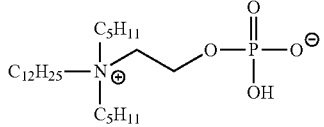
(1-J)

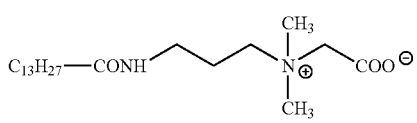
(1-K)

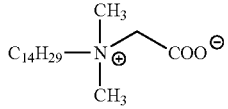
(1-L)

-continued

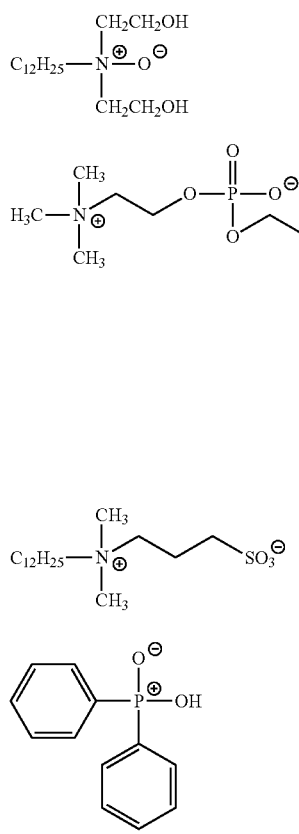

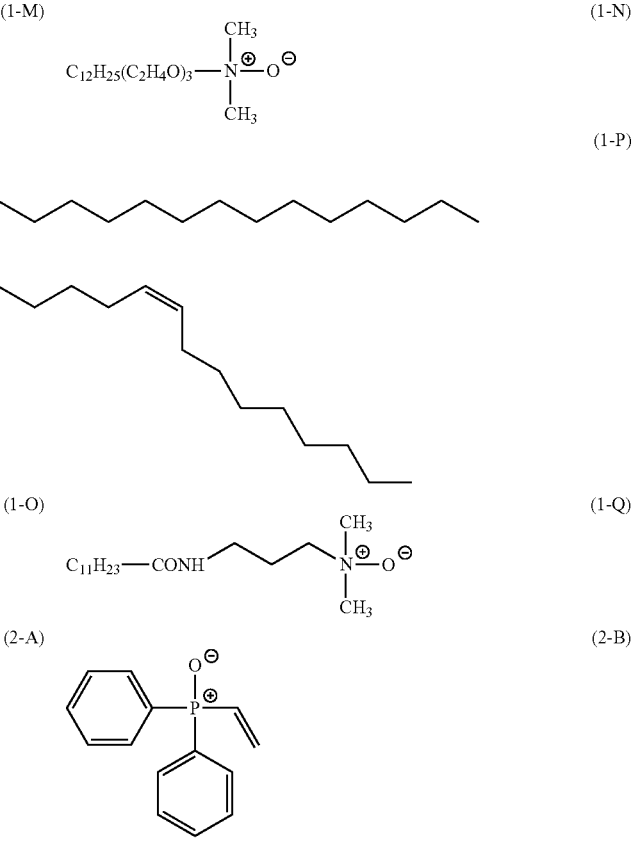

Furthermore, examples of the surfactant also include known anionic surfactants, cationic surfactants, amphoteric surfactants, and nonionic surfactants. Moreover, a fluorine-based or silicone-based nonionic surfactant may also be used in the same manner.

With regard to the surfactant, one type may be used on its own or two or more types may be used in combination.

It is not necessary to particularly limit the amount of surfactant used, but it is preferably 0.01 to 20 wt % relative to the total weight of the rinsing liquid, and more preferably 0.05 to 10 wt %.

The relief printing plate of the present invention having a relief layer can be obtained as described above.

From the viewpoint of satisfying suitability for various aspects of printing, such as abrasion resistance and ink transfer properties, the thickness of the relief layer of the relief printing plate is preferably 0.05 mm to 10 mm, more preferably 0.05 mm to 7 mm, and yet more preferably 0.05 mm to 3 mm.

Furthermore, the Shore A hardness of the relief layer of the relief printing plate at 25° C. is preferably 50° to 90°. When the Shore A hardness of the relief layer is at least 50°, even if fine halftone dots formed by engraving receive a strong printing pressure from a letterpress printer, they do not collapse and close up, and normal printing can be carried out. Furthermore, when the Shore A hardness of the relief layer is no greater than 90°, even for flexographic printing with kiss touch printing pressure it is possible to prevent patchy printing in a solid printed part.

The Shore A hardness in the present specification is a value measured by a durometer (a spring type rubber hardness meter) that presses an indenter (called a pressing needle or indenter) into the surface of a measurement target at 25° C. so as to deform it, measures the amount of deformation (indentation depth), and converts it into a numerical value.

The relief printing plate of the present invention is particularly suitable for printing by a flexographic printer using an aqueous ink, but printing is also possible when it is carried out by a letterpress printer using any of aqueous, oil-based, and UV inks, and printing is also possible when it is carried out by a flexographic printer using a UV ink. The relief printing plate of the present invention has excellent rinsing properties, there is little or no engraving residue, since a relief layer obtained has excellent elasticity aqueous ink transfer properties and printing durability are excellent, and printing can be carried out for a long period of time without plastic deformation of the relief layer or degradation of printing durability.

In accordance with the present invention, there can be provided a relief printing plate precursor for laser engraving that has excellent rinsing properties for engraving residue generated when laser-engraving, a process for making a relief printing plate employing same, and a relief printing plate obtained by the plate making process.

EXAMPLES

The present invention is explained in further detail below by reference to Examples, but the present invention should not be construed as being limited to these Examples.

Example 1

Components (Component A, Component B, Component H, Component I, and solvent) were mixed in accordance with the mixture contents shown in Table 1, placed in a three-necked flask equipped with a stirring blade and a condenser, and heated and dissolved while stirring at 70° C. for 120 minutes. A 3 mm thick spacer (frame) was placed on a PET substrate, and the above resin composition was kept at 70° C. and cast gently so that it did not flow out from the spacer (frame). As a curing method, a coating was placed in an oven, kept at 95° C. for 1 hour, and then heated at 85° C. for 3 hours. The crosslinked relief-forming layer thus obtained was subjected to engraving by a semiconductor laser.

As a semiconductor laser engraving machine, laser recording equipment provided with an SDL-6390 fiber-coupled semiconductor laser (FC-LD) (JDSU, wavelength 915 nm) with a maximum output of 8.0 W was used. A 1 cm square solid printed part was raster-engraved using the semiconductor laser engraving machine under conditions of a laser output of 7.5 W, a head speed of 409 mm/sec, and a pitch setting of 2,400 DPI. The thickness of the relief layer of the relief printing plate was 1.28 mm. Furthermore, when the Shore A hardness of the relief layer was measured, it was found to be 78°.

Examples 2 to 42 and Comparative Examples 1 to 3

Resin compositions for laser engraving, relief printing plate precursors for laser engraving, and relief printing plates of Examples 2 to 42 and Comparative Examples 1 to 3 were obtained by the same method as in Example 1 using components, solvents, and engraving lasers given in Tables 1 to 3.

In Example 42, engraving was carried out using a carbon dioxide laser. As a carbon dioxide laser ($CO_2$ laser) engraving machine, an ML-9100 series high quality $CO_2$ laser marker (Keyence) was used. After a protection film was peeled off from the relief printing plate precursor for laser engraving, a 1 cm square solid printed part was raster-engraved using the carbon dioxide laser engraving machine under conditions of an output of 12 W, a head speed of 200 mm/sec, and a pitch setting of 2,400 DPI.

Evaluation of Rinsing Properties

A rinsing liquid was prepared by mixing water, a 10 wt % aqueous solution of sodium hydroxide, and betaine compound (1-B) below so that the pH was 12 and the content of betaine compound (1-B) was 1 wt % of the total rinsing liquid.

The rinsing liquid thus prepared was dropped (about 100 mL/m$^2$) by means of a dropper onto a relief printing plate engraved by the above-mentioned method so that the plate surface became uniformly wet, and immediately rubbed using a toothbrush (Clinica Toothbrush Flat, Lion Corporation) 10 times (15 sec) in parallel to the plate with a load of 100 gf. Subsequently, the plate face was washed with running water, moisture of the plate face was removed, and it was dried naturally for approximately 1 hour.

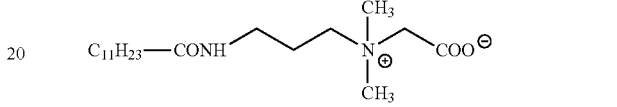

(1-B)

After the rinsing step, unremoved residue on the naturally dried plate was evaluated by examining the plate surface using a 100× magnification microscope (Keyence). Evaluation criteria were as follows.
Excellent: no residue, Good: almost no residue, Good/Fair: some residue, Fair: between Good/Fair and Fair/Poor, Fair/Poor: a little residue was removed, Poor: hardly any residue was removed Those other than Poor were evaluated as a pass.

For each of the components used in Examples and Comparative Examples, the structural formula or compound name is shown below.
<(Component A) Silane Compound (Compound Having Hydrolyzable Silyl Group and/or Silanol Group)>

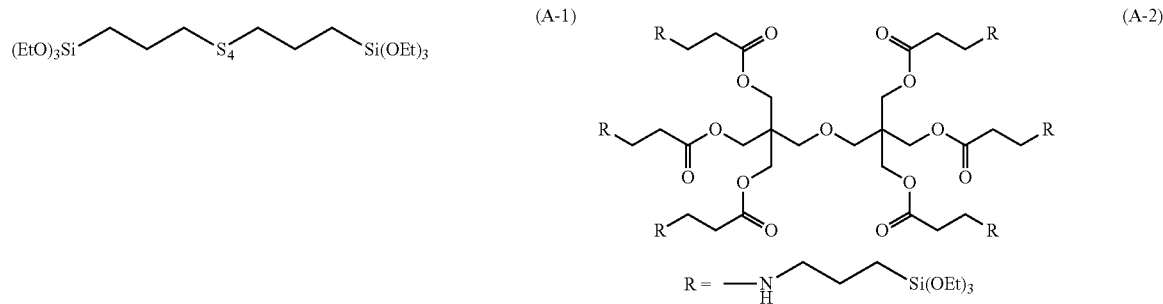

Mixture of

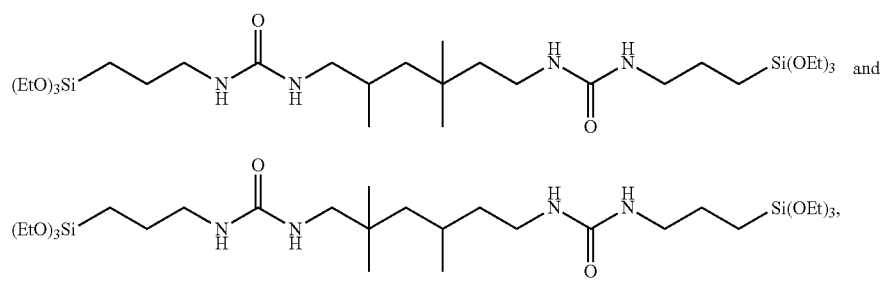

-continued
(A-4)
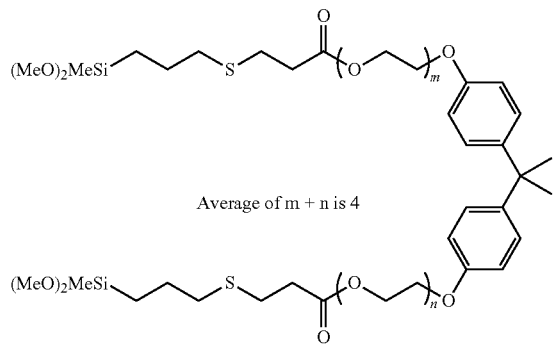
Average of m + n is 4
(A-5)
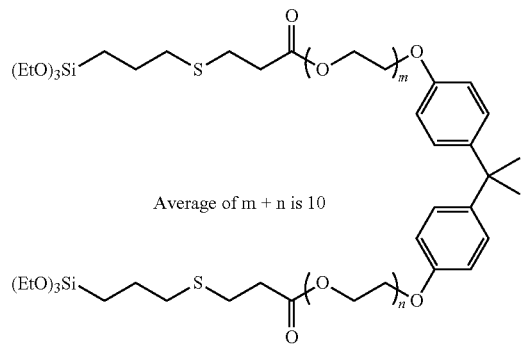
Average of m + n is 10
(A-6)
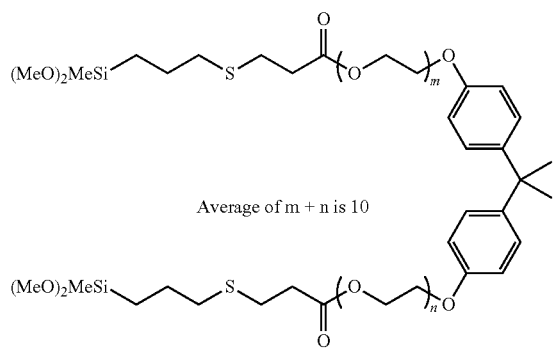
Average of m + n is 10
(A-7)
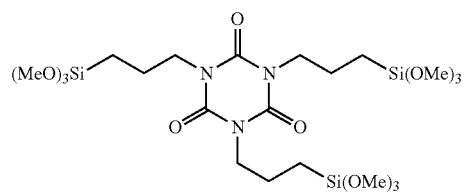
(A-8)
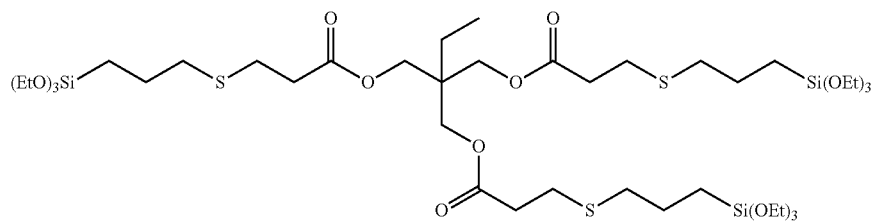
(A-9)
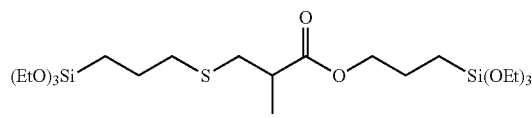
(A-10)
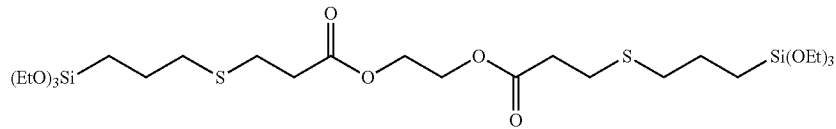
(A-11)
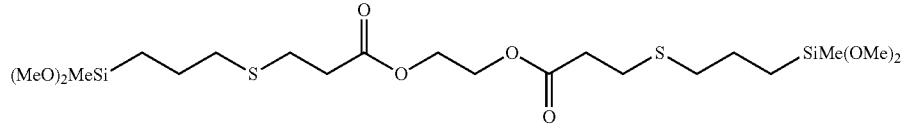
(A-12)
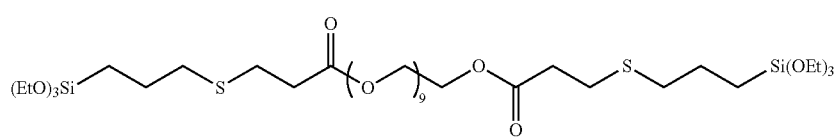

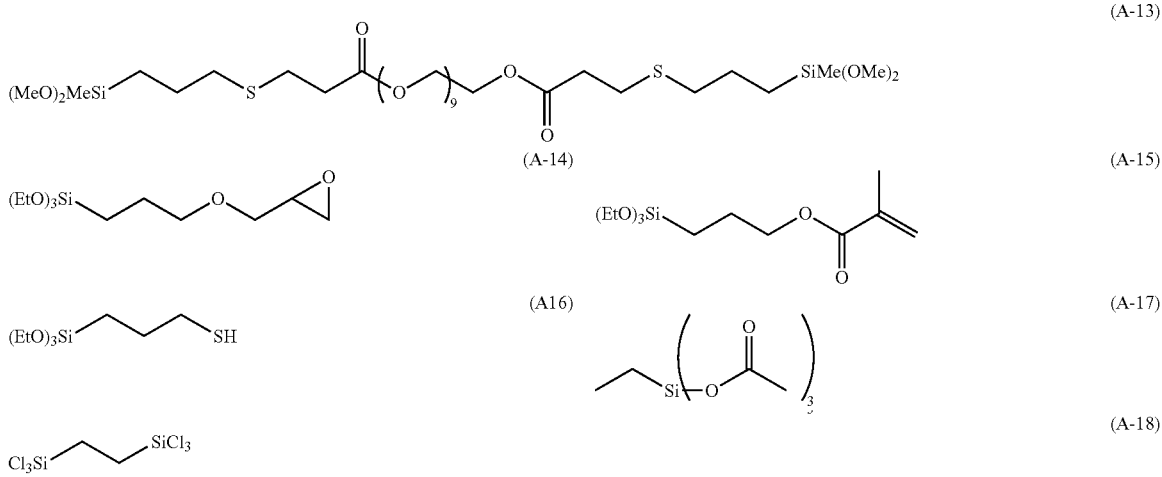

<(Component B) Binder Polymer>
PVB; polyvinyl butyral (Denka Butyral #3000-2, l:m:n=56 mol %:43 mol %:1 mol % in the formula below, weight-average molecular weight: 90,000, Denki Kagaku Kogyo Kabushiki Kaisha)

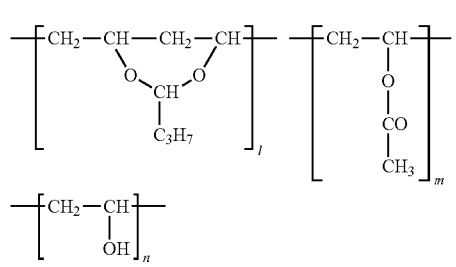

<(Component C) Crosslinking Catalyst>
C-1: phosphoric acid
C-2: 1,8-diazabicyclo[5.4.0]undec-7-ene (San-Apro Ltd.)
C-3: 1,5-diazabicyclo[4.3.0]non-5-ene (San-Apro Ltd.)
C-4: 1,1,3,3-tetramethylguanidine (Tokyo Chemical Industry Co., Ltd.)
C-5: Epomin SP-006 (Nippon Shokubai Co., Ltd.)
C-6: boron trifluoride monoethylamine complex (Wako Pure Chemical Industries, Ltd.)
<(Component D) Plasticizer>
D-1: bis(2-ethylhexyl) phthalate (Tokyo Chemical Industry Co., Ltd.)
D-2: tributyl citrate (Tokyo Chemical Industry Co., Ltd.)
D-3: Shell Ondina Oil 32 (Showa Shell Sekiyu K.K.)

<(Component E) Polymerizable Compound>
E-1: glycerol dimethacrylate (Tokyo Chemical Industry Co., Ltd.)
E-2: 1,6-hexanediol diacrylate (Tokyo Chemical Industry Co., Ltd.)
E-3: Ebecryl 5129 (Daicel-Cytec Company Ltd., molecular weight 800)
E-4: Ebecryl 8210 (Daicel-Cytec Company Ltd., molecular weight 600)
E-5: Ebecryl 3105 (Daicel-Cytec Company Ltd., molecular weight 900)
E-6: Ebecryl 270 (Daicel-Cytec Company Ltd., molecular weight 1,500)
<(Component F) Polymerization Initiator>
F-1: tert-butyl peroxybenzoate (NOF Corporation, Perbutyl Z)
F-2: 2,2'-azobis(2,4-dimethylvaleronitrile) (Wako Pure Chemical Industries, Ltd., V-65)
<(Component G) Inorganic Particles>
G-1: SP#2300 (Nitto Funka Kogyou K.K, average particle size 1.25 μm, porous)
G-2: 200-CF (Nippon Aerosil Co., Ltd., average primary particle size 12 nm, nonporous)
G-3: Aerosil R8200 (Evonic Degussa Japan, average primary particle size 12 nm, nonporous)
<(Component H) Photothermal Conversion Agent>
H-1: Ketjen Black (Lion Corporation, EC600JD)
H-2: carbon black (Tokai Carbon Co., Ltd., N330, HAF carbon)
<(Component I) Fragrance>
I-1: vanillin (Wako Pure Chemical Industries, Ltd.)
I-2: 1-menthol (Wako Pure Chemical Industries, Ltd.)
<Solvent>
PGMEA: propylene glycol monomethyl ether

TABLE 1

| Example/Comparative Example | (Component A) silane compound | | (Component B) binder polymer | | (Component C) crosslinking catalyst | | (Component D) plasticizer | | (Component E) polymerizable compound | | (Component F) polymerization initiator | |
|---|---|---|---|---|---|---|---|---|---|---|---|---|
| | Sample | wt % | Sample | Wt % | Sample | wt % | Sample | wt % | Sample | wt % | Sample | wt % |
| Ex. 1 | A-4 | 96.2 | PVB | 1.8 | — | 0.0 | — | 0.0 | — | 0.0 | — | 0.0 |
| Ex. 2 | A-4 | 98.0 | — | 0.0 | — | 0.0 | — | 0.0 | — | 0.0 | — | 0.0 |
| Ex. 3 | A-4 | 95.2 | PVB | 1.8 | C-1 | 1.0 | — | 0.0 | — | 0.0 | — | 0.0 |
| Ex. 4 | A-4 | 85.2 | PVB | 1.8 | C-1 | 1.0 | D-1 | 10.0 | — | 0.0 | — | 0.0 |

TABLE 1-continued

| Example/Comparative Example | (Component A) silane compound | | (Component B) binder polymer | | (Component C) crosslinking catalyst | | (Component D) plasticizer | | (Component E) polymerizable compound | | (Component F) polymerization initiator | |
|---|---|---|---|---|---|---|---|---|---|---|---|---|
| | Sample | wt % | Sample | wt % | Sample | wt % | Sample | wt % | Sample | wt % | Sample | wt % |
| Ex. 5 | A-4 | 54.5 | PVB | 1.8 | C-1 | 1.0 | D-1 | 20.0 | E-1 | 20.0 | F-1 | 0.7 |
| Ex. 6 | A-4 | 52.5 | PVB | 1.8 | C-1 | 1.0 | D-1 | 20.0 | E-1 | 20.0 | F-1 | 0.7 |
| Ex. 7 | A-4 | 52.5 | PVB | 1.8 | C-1 | 1.0 | D-1 | 20.0 | E-1 | 20.0 | F-1 | 0.7 |
| Ex. 8 | A-4 | 52.5 | PVB | 1.8 | C-1 | 1.0 | D-1 | 20.0 | E-1 | 20.0 | F-1 | 0.7 |
| Ex. 9 | A-4 | 54.5 | PVB | 1.8 | C-1 | 1.0 | D-1 | 20.0 | E-1 | 20.0 | F-2 | 0.7 |
| Ex. 10 | A-4 | 54.5 | PVB | 1.8 | C-1 | 1.0 | D-1 | 20.0 | E-2 | 20.0 | F-1 | 0.7 |
| Ex. 11 | A-4 | 54.5 | PVB | 1.8 | C-1 | 1.0 | D-1 | 20.0 | E-3 | 20.0 | F-1 | 0.7 |
| Ex. 12 | A-4 | 54.5 | PVB | 1.8 | C-1 | 1.0 | D-1 | 20.0 | E-4 | 20.0 | F-1 | 0.7 |
| Ex. 13 | A-4 | 54.5 | PVB | 1.8 | C-1 | 1.0 | D-1 | 20.0 | E-5 | 20.0 | F-1 | 0.7 |
| Ex. 14 | A-4 | 54.5 | PVB | 1.8 | C-1 | 1.0 | D-1 | 20.0 | E-6 | 20.0 | F-1 | 0.7 |
| Ex. 15 | A-4 | 54.5 | PVB | 1.8 | C-1 | 1.0 | D-2 | 20.0 | E-1 | 20.0 | F-1 | 0.7 |
| Ex. 16 | A-4 | 54.5 | PVB | 1.8 | C-1 | 1.0 | D-3 | 20.0 | E-1 | 20.0 | F-1 | 0.7 |
| Ex. 17 | A-4 | 54.5 | PVB | 1.8 | C-2 | 1.0 | D-1 | 20.0 | E-1 | 20.0 | F-1 | 0.7 |
| Ex. 18 | A-4 | 54.5 | PVB | 1.8 | C-3 | 1.0 | D-1 | 20.0 | E-1 | 20.0 | F-1 | 0.7 |
| Ex. 19 | A-4 | 54.5 | PVB | 1.8 | C-4 | 1.0 | D-1 | 20.0 | E-1 | 20.0 | F-1 | 0.7 |
| Ex. 20 | A-4 | 54.5 | PVB | 1.8 | C-5 | 1.0 | D-1 | 20.0 | E-1 | 20.0 | F-1 | 0.7 |
| Ex. 21 | A-4 | 54.5 | PVB | 1.8 | C-6 | 1.0 | D-1 | 20.0 | E-1 | 20.0 | F-1 | 0.7 |
| Ex. 22 | A-1 | 54.5 | PVB | 1.8 | C-1 | 1.0 | D-1 | 20.0 | E-1 | 20.0 | F-1 | 0.7 |
| Ex. 23 | A-2 | 54.5 | PVB | 1.8 | C-1 | 1.0 | D-1 | 20.0 | E-1 | 20.0 | F-1 | 0.7 |

| Example/Comparative Example | (Component G) inorganic particles | | (Component H) photothermal conversion agent | | (Component I) fragrance | | Solvent (amount added relative to Component A to Component I as 100 wt %) | |
|---|---|---|---|---|---|---|---|---|
| | Sample | wt % | Sample | wt % | Sample | wt % | Type | wt % |
| Ex. 1 | — | 0.0 | H-1 | 1.0 | I-1 | 1.0 | PGMEA | 20.0 |
| Ex. 2 | — | 0.0 | H-1 | 1.0 | I-1 | 1.0 | PGMEA | 20.0 |
| Ex. 3 | — | 0.0 | H-1 | 1.0 | I-1 | 1.0 | PGMEA | 20.0 |
| Ex. 4 | — | 0.0 | H-1 | 1.0 | I-1 | 1.0 | PGMEA | 20.0 |
| Ex. 5 | — | 0.0 | H-1 | 1.0 | I-1 | 1.0 | PGMEA | 20.0 |
| Ex. 6 | G-1 | 2.0 | H-1 | 1.0 | I-1 | 1.0 | PGMEA | 20.0 |
| Ex. 7 | G-2 | 2.0 | H-1 | 1.0 | I-1 | 1.0 | PGMEA | 20.0 |
| Ex. 8 | G-3 | 2.0 | H-1 | 1.0 | I-1 | 1.0 | PGMEA | 20.0 |
| Ex. 9 | — | 0.0 | H-1 | 1.0 | I-1 | 1.0 | PGMEA | 20.0 |
| Ex. 10 | — | 0.0 | H-1 | 1.0 | I-1 | 1.0 | PGMEA | 20.0 |
| Ex. 11 | — | 0.0 | H-1 | 1.0 | I-1 | 1.0 | PGMEA | 20.0 |
| Ex. 12 | — | 0.0 | H-1 | 1.0 | I-1 | 1.0 | PGMEA | 20.0 |
| Ex. 13 | — | 0.0 | H-1 | 1.0 | I-1 | 1.0 | PGMEA | 20.0 |
| Ex. 14 | — | 0.0 | H-1 | 1.0 | I-1 | 1.0 | PGMEA | 20.0 |
| Ex. 15 | — | 0.0 | H-1 | 1.0 | I-1 | 1.0 | PGMEA | 20.0 |
| Ex. 16 | — | 0.0 | H-1 | 1.0 | I-1 | 1.0 | PGMEA | 20.0 |
| Ex. 17 | — | 0.0 | H-1 | 1.0 | I-1 | 1.0 | PGMEA | 20.0 |
| Ex. 18 | — | 0.0 | H-1 | 1.0 | I-1 | 1.0 | PGMEA | 20.0 |
| Ex. 19 | — | 0.0 | H-1 | 1.0 | I-1 | 1.0 | PGMEA | 20.0 |
| Ex. 20 | — | 0.0 | H-1 | 1.0 | I-1 | 1.0 | PGMEA | 20.0 |
| Ex. 21 | — | 0.0 | H-1 | 1.0 | I-1 | 1.0 | PGMEA | 20.0 |
| Ex. 22 | — | 0.0 | H-1 | 1.0 | I-1 | 1.0 | PGMEA | 20.0 |
| Ex. 23 | — | 0.0 | H-1 | 1.0 | I-1 | 1.0 | PGMEA | 20.0 |

TABLE 2

| Example/Comparative Example | (Component A) silane compound | | (Component B) binder polymer | | (Component C) crosslinking catalyst | | (Component D) plasticizer | | (Component E) polymerizable compound | | (Component F) polymerization initiator | |
|---|---|---|---|---|---|---|---|---|---|---|---|---|
| | Sample | wt % | Sample | Wt % | Sample | wt % | Sample | wt % | Sample | wt % | Sample | wt % |
| Ex. 24 | A-3 | 54.5 | PVB | 1.8 | C-1 | 1.0 | D-1 | 20.0 | E-1 | 20.0 | F-1 | 0.7 |
| Ex. 25 | A-5 | 54.5 | PVB | 1.8 | C-1 | 1.0 | D-1 | 20.0 | E-1 | 20.0 | F-1 | 0.7 |
| Ex. 26 | A-6 | 54.5 | PVB | 1.8 | C-1 | 1.0 | D-1 | 20.0 | E-1 | 20.0 | F-1 | 0.7 |
| Ex. 27 | A-7 | 54.5 | PVB | 1.8 | C-1 | 1.0 | D-1 | 20.0 | E-1 | 20.0 | F-1 | 0.7 |
| Ex. 28 | A-8 | 54.5 | PVB | 1.8 | C-1 | 1.0 | D-1 | 20.0 | E-1 | 20.0 | F-1 | 0.7 |
| Ex. 29 | A-9 | 54.5 | PVB | 1.8 | C-1 | 1.0 | D-1 | 20.0 | E-1 | 20.0 | F-1 | 0.7 |
| Ex. 30 | A-10 | 54.5 | PVB | 1.8 | C-1 | 1.0 | D-1 | 20.0 | E-1 | 20.0 | F-1 | 0.7 |
| Ex. 31 | A-11 | 54.5 | PVB | 1.8 | C-1 | 1.0 | D-1 | 20.0 | E-1 | 20.0 | F-1 | 0.7 |
| Ex. 32 | A-12 | 54.5 | PVB | 1.8 | C-1 | 1.0 | D-1 | 20.0 | E-1 | 20.0 | F-1 | 0.7 |
| Ex. 33 | A-13 | 54.5 | PVB | 1.8 | C-1 | 1.0 | D-1 | 20.0 | E-1 | 20.0 | F-1 | 0.7 |
| Ex. 34 | A-14 | 54.5 | PVB | 1.8 | C-1 | 1.0 | D-1 | 20.0 | E-1 | 20.0 | F-1 | 0.7 |
| Ex. 35 | A-15 | 54.5 | PVB | 1.8 | C-1 | 1.0 | D-1 | 20.0 | E-1 | 20.0 | F-1 | 0.7 |
| Ex. 36 | A-16 | 54.5 | PVB | 1.8 | C-1 | 1.0 | D-1 | 20.0 | E-1 | 20.0 | F-1 | 0.7 |
| Ex. 37 | A-17 | 54.5 | PVB | 1.8 | C-1 | 1.0 | D-1 | 20.0 | E-1 | 20.0 | F-1 | 0.7 |
| Ex. 38 | A-18 | 54.5 | PVB | 1.8 | C-1 | 1.0 | D-1 | 20.0 | E-1 | 20.0 | F-1 | 0.7 |
| Ex. 39 | A-4 | 54.5 | PVB | 1.8 | C-1 | 1.0 | D-1 | 20.0 | E-1 | 20.0 | F-1 | 0.7 |

TABLE 2-continued

| | | | | | | | | | | | |
|---|---|---|---|---|---|---|---|---|---|---|---|
| Ex. 40 | A-4 | 54.5 | PVB | 1.8 | C-1 | 1.0 | D-1 | 20.0 | E-1 | 20.0 | F-1 | 0.7 |
| Ex. 41 | A-5 | 54.5 | — | 0.0 | C-1 | 1.0 | D-1 | 20.0 | E-1 | 20.0 | F-1 | 0.7 |
| Ex. 42 | A-4 | 54.5 | PVB | 1.8 | C-1 | 1.0 | D-1 | 20.0 | E-1 | 20.0 | F-1 | 0.7 |
| Comp. Ex. 1 | A-4 | 93.0 | PVB | 5.0 | — | 0.0 | — | 0.0 | — | 0.0 | — | 0.0 |
| Comp. Ex. 2 | A-4 | 93.0 | PVB | 10.0 | — | 0.0 | — | 0.0 | — | 0.0 | — | 0.0 |
| Comp. Ex. 3 | — | 0.0 | — | 0.0 | — | 0.0 | D-1 | 30.0 | E-2 | 65.0 | F-2 | 1.0 |

| Example/Comparative Example | (Component G) inorganic particles | | (Component H) photothermal conversion agent | | (Component I) fragrance | | Solvent (amount added relative to Component A to Component I as 100 wt %) | |
|---|---|---|---|---|---|---|---|---|
| | Sample | wt % | Sample | wt % | Sample | wt % | Type | wt % |
| Ex. 24 | — | 0.0 | H-1 | 1.0 | I-1 | 1.0 | PGMEA | 20.0 |
| Ex. 25 | — | 0.0 | H-1 | 1.0 | I-1 | 1.0 | PGMEA | 20.0 |
| Ex. 26 | — | 0.0 | H-1 | 1.0 | I-1 | 1.0 | PGMEA | 20.0 |
| Ex. 27 | — | 0.0 | H-1 | 1.0 | I-1 | 1.0 | PGMEA | 20.0 |
| Ex. 28 | — | 0.0 | H-1 | 1.0 | I-1 | 1.0 | PGMEA | 20.0 |
| Ex. 29 | — | 0.0 | H-1 | 1.0 | I-1 | 1.0 | PGMEA | 20.0 |
| Ex. 30 | — | 0.0 | H-1 | 1.0 | I-1 | 1.0 | PGMEA | 20.0 |
| Ex. 31 | — | 0.0 | H-1 | 1.0 | I-1 | 1.0 | PGMEA | 20.0 |
| Ex. 32 | — | 0.0 | H-1 | 1.0 | I-1 | 1.0 | PGMEA | 20.0 |
| Ex. 33 | — | 0.0 | H-1 | 1.0 | I-1 | 1.0 | PGMEA | 20.0 |
| Ex. 34 | — | 0.0 | H-1 | 1.0 | I-1 | 1.0 | PGMEA | 20.0 |
| Ex. 35 | — | 0.0 | H-1 | 1.0 | I-1 | 1.0 | PGMEA | 20.0 |
| Ex. 36 | — | 0.0 | H-1 | 1.0 | I-1 | 1.0 | PGMEA | 20.0 |
| Ex. 37 | — | 0.0 | H-1 | 1.0 | I-1 | 1.0 | PGMEA | 20.0 |
| Ex. 38 | — | 0.0 | H-1 | 1.0 | I-1 | 1.0 | PGMEA | 20.0 |
| Ex. 39 | — | 0.0 | H-1 | 1.0 | I-2 | 1.0 | PGMEA | 20.0 |
| Ex. 40 | — | 0.0 | H-2 | 1.0 | I-1 | 1.0 | PGMEA | 20.0 |
| Ex. 41 | — | 0.0 | H-1 | 1.0 | I-1 | 1.0 | — | 0.0 |
| Ex. 42 | — | 0.0 | H-1 | 1.0 | I-1 | 1.0 | PGMEA | 20.0 |
| Comp. Ex. 1 | — | 0.0 | H-1 | 1.0 | I-1 | 1.0 | PGMEA | 20.0 |
| Comp. Ex. 2 | — | 0.0 | H-1 | 1.0 | I-1 | 1.0 | PGMEA | 20.0 |
| Comp. Ex. 3 | G-1 | 2.0 | H-1 | 1.0 | I-1 | 1.0 | PGMEA | 20.0 |

TABLE 3

| Example/Comparative Example | Relief layer | | Laser for engraving | Rinsing properties |
|---|---|---|---|---|
| | Thickness [mm] | Shore A hardness [°] | | |
| Ex. 1 | 1.28 | 78 | Semiconductor laser | Fair |
| Ex. 2 | 1.28 | 79 | Semiconductor laser | Good/Fair |
| Ex. 3 | 1.22 | 88 | Semiconductor laser | Good/Fair |
| Ex. 4 | 1.28 | 72 | Semiconductor laser | Good/Fair |
| Ex. 5 | 1.11 | 80 | Semiconductor laser | Good |
| Ex. 6 | 1.07 | 81 | Semiconductor laser | Excellent |
| Ex. 7 | 1.23 | 75 | Semiconductor laser | Excellent |
| Ex. 8 | 1.30 | 76 | Semiconductor laser | Excellent |
| Ex. 9 | 1.22 | 82 | Semiconductor laser | Fair |
| Ex. 10 | 1.16 | 80 | Semiconductor laser | Good/Fair |
| Ex. 11 | 1.21 | 79 | Semiconductor laser | Good |
| Ex. 12 | 1.11 | 81 | Semiconductor laser | Good |
| Ex. 13 | 1.18 | 82 | Semiconductor laser | Good |
| Ex. 14 | 1.12 | 83 | Semiconductor laser | Fair |
| Ex. 15 | 1.18 | 77 | Semiconductor laser | Good |
| Ex. 16 | 1.32 | 75 | Semiconductor laser | Good |
| Ex. 17 | 1.28 | 78 | Semiconductor laser | Good/Fair |
| Ex. 18 | 1.22 | 74 | Semiconductor laser | Good/Fair |
| Ex. 19 | 1.23 | 74 | Semiconductor laser | Good/Fair |
| Ex. 20 | 1.20 | 75 | Semiconductor laser | Good/Fair |
| Ex. 21 | 1.19 | 73 | Semiconductor laser | Good/Fair |
| Ex. 22 | 1.20 | 78 | Semiconductor laser | Good/Fair |
| Ex. 23 | 1.12 | 71 | Semiconductor laser | Good/Fair |
| Ex. 24 | 1.15 | 76 | Semiconductor laser | Good/Fair |
| Ex. 25 | 1.31 | 77 | Semiconductor laser | Good |
| Ex. 26 | 1.22 | 73 | Semiconductor laser | Excellent |
| Ex. 27 | 1.28 | 87 | Semiconductor laser | Good/Fair |
| Ex. 28 | 1.33 | 80 | Semiconductor laser | Good/Fair |
| Ex. 29 | 1.19 | 77 | Semiconductor laser | Good |
| Ex. 30 | 1.09 | 78 | Semiconductor laser | Good/Fair |

TABLE 3-continued

| Example/Comparative Example | Relief layer Thickness [mm] | Shore A hardness [°] | Laser for engraving | Rinsing properties |
|---|---|---|---|---|
| Ex. 31 | 1.25 | 87 | Semiconductor laser | Good |
| Ex. 32 | 1.30 | 71 | Semiconductor laser | Good |
| Ex. 33 | 1.25 | 68 | Semiconductor laser | Excellent |
| Ex. 34 | 1.28 | 73 | Semiconductor laser | Fair |
| Ex. 35 | 1.22 | 72 | Semiconductor laser | Fair/Poor |
| Ex. 36 | 1.28 | 72 | Semiconductor laser | Fair |
| Ex. 37 | 1.23 | 69 | Semiconductor laser | Fair |
| Ex. 38 | 1.30 | 74 | Semiconductor laser | Fair |
| Ex. 39 | 1.24 | 77 | Semiconductor laser | Good |
| Ex. 40 | 1.34 | 74 | Semiconductor laser | Good |
| Ex. 41 | 1.28 | 78 | Semiconductor laser | Good |
| Ex. 42 | 1.14 | 77 | $CO_2$ laser | Good |
| Comp. Ex. 1 | 1.22 | 75 | Semiconductor laser | Poor |
| Comp. Ex. 2 | 1.19 | 85 | Semiconductor laser | Poor |
| Comp. Ex. 3 | 1.27 | 95 | Semiconductor laser | Poor |

What is claimed is:

1. A relief printing plate precursor for laser engraving comprising above a support, as a crosslinked relief-forming layer:
   a thermally crosslinked layer of a resin composition for laser engraving that comprises as a Component A a compound containing either a hydrolyzable silyl group, a silanol group, or both, and that does not comprise as a Component B a binder polymer or comprises the binder polymer as a Component B at less than 2 wt % relative to the total weight of the resin composition for laser engraving on a non-volatile component basis,
   wherein the Component A has two or three groups selected from the group consisting of an alkoxy group and a hydroxy group in total on the same silicon atom, and has 2 to 6 groups in total selected from the group consisting of a hydrolyzable silyl group and a silanol group, and the minimum number of atoms connecting silicon atoms contained in Component A is at least 10.

2. The relief printing plate precursor for laser engraving according to claim 1, wherein the Component A does not contain an ethylenically unsaturated bond.

3. The relief printing plate precursor for laser engraving according to claim 1, wherein the resin composition for laser engraving further comprises as a Component C a crosslinking catalyst for promoting formation of a crosslinked structure of the Component A.

4. The relief printing plate precursor for laser engraving according to claim 1, wherein the resin composition for laser engraving further comprises as a Component D a plasticizer.

5. The relief printing plate precursor for laser engraving according to claim 1, wherein the resin composition for laser engraving further comprises as a Component E a polymerizable compound.

6. The relief printing plate precursor for laser engraving according to claim 1, wherein the resin composition for laser engraving further comprises as a Component F a polymerization initiator.

7. The relief printing plate precursor for laser engraving according to claim 1, wherein the resin composition for laser engraving further comprises as a Component G inorganic particles.

8. The relief printing plate precursor for laser engraving according to claim 1, wherein the resin composition for laser engraving further comprises as a Component H a photothermal conversion agent.

9. The relief printing plate precursor for laser engraving according to claim 1, wherein the resin composition for laser engraving further comprises as a Component I a fragrance.

10. A process for making a relief printing plate, comprising:
    a step of preparing the relief printing plate precursor for laser engraving according to claim 1;
    and a step of forming a relief layer by laser-engraving the crosslinked relief-forming layer.

11. The process for making a relief printing plate according to claim 10, wherein the process further comprises
    a rinsing step of rinsing the engraved relief layer surface by means of an aqueous rinsing liquid.

12. A relief printing plate comprising a relief layer formed by the process for making a relief printing plate according to claim 10.

13. The relief printing plate according to claim 12, wherein the relief layer has a thickness of at least 0.05 mm but no greater than 10 mm.

14. The relief printing plate according to claim 12, wherein the relief layer has a Shore A hardness at 25° C. of at least 50° but no greater than 90°.

15. The relief printing plate precursor for laser engraving according to claim 1, wherein the content of the Component A contained in the resin composition for laser engraving is in the range of 50 to 100 wt % on a non-volatile component basis.

16. The relief printing plate precursor for laser engraving according to claim 1, wherein the Component A has two groups selected from the group consisting of an alkoxy group and a hydroxyl group in total on the same silicon atom.

* * * * *